(12) United States Patent
Meir et al.

(10) Patent No.: US 8,400,858 B2
(45) Date of Patent: Mar. 19, 2013

(54) MEMORY DEVICE WITH REDUCED SENSE TIME READOUT

(75) Inventors: Avraham Meir, Rishon Le-Zion (IL);
Naftali Sommer, Rishon Le-Zion (IL);
Eyal Gurgi, Petah-Tikva (IL)

(73) Assignee: Apple Inc., Cupertino, CA (US)

( * ) Notice: Subject to any disclaimer, the term of this patent is extended or adjusted under 35 U.S.C. 154(b) by 24 days.

(21) Appl. No.: 13/214,257

(22) Filed: Aug. 22, 2011

(65) Prior Publication Data

US 2012/0320671 A1 Dec. 20, 2012

Related U.S. Application Data (63) Continuation-in-part of application No. 12/405,275, filed on Mar. 17, 2009, now Pat. No. 8,059,457.

(60) Provisional application No. 61/119,929, filed on Dec. 4, 2008, provisional application No. 61/037,327, filed on Mar. 18, 2008.

(51) Int. Cl.
*G11C 7/02* (2006.01)

(52) U.S. Cl. ........ 365/207; 365/205; 365/206; 365/204; 365/189.07; 365/189.15; 365/185.03

(58) Field of Classification Search ............... 365/207, 365/205, 206, 204, 189.07, 189.15, 185.03
See application file for complete search history.

(56) References Cited

U.S. PATENT DOCUMENTS

| | | | |
|---|---|---|---|
| 3,668,631 A | 6/1972 | Griffith et al. |
| 3,668,632 A | 6/1972 | Oldham |
| 4,058,851 A | 11/1977 | Scheuneman |
| 4,112,502 A | 9/1978 | Scheuneman |
| 4,394,763 A | 7/1983 | Nagano et al. |
| 4,413,339 A | 11/1983 | Riggle et al. |
| 4,556,961 A | 12/1985 | Iwahashi et al. |
| 4,558,431 A | 12/1985 | Satoh |
| 4,608,687 A | 8/1986 | Dutton |
| 4,654,847 A | 3/1987 | Dutton |
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |
| 4,993,029 A | 2/1991 | Galbraith et al. |
| 5,056,089 A | 10/1991 | Furuta et al. |
| 5,077,722 A | 12/1991 | Geist et al. |

(Continued)

FOREIGN PATENT DOCUMENTS

| | | |
|---|---|---|
| EP | 0783754 B1 | 7/1997 |
| EP | 1434236 B1 | 6/2004 |

(Continued)

OTHER PUBLICATIONS

U.S. Appl. No. 12/323,544 Office Action dated Dec. 13, 2011.

(Continued)

*Primary Examiner* — Viet Q Nguyen
(74) *Attorney, Agent, or Firm* — Meyertons, Hood, Kivlin, Kowert & Goetzel, P.C.

(57) ABSTRACT

A method for data storage includes providing at least first and second readout configurations for reading storage values from analog memory cells, such that the first readout configuration reads the storage values with a first sense time and the second readout configuration reads the storage values with a second sense time, shorter than the first sense time. A condition is evaluated with respect to a read operation that is to be performed over a group of the memory cells. One of the first and second readout configurations is selected responsively to the evaluated condition. The storage values are read from the group of the memory cells using the selected readout configuration.

29 Claims, 3 Drawing Sheets

U.S. PATENT DOCUMENTS

| | | |
|---|---|---|
| 5,126,808 A | 6/1992 | Montalvo et al. |
| 5,163,021 A | 11/1992 | Mehrotra et al. |
| 5,172,338 A | 12/1992 | Mehrotta et al. |
| 5,182,558 A | 1/1993 | Mayo |
| 5,182,752 A | 1/1993 | DeRoo et al. |
| 5,191,584 A | 3/1993 | Anderson |
| 5,200,959 A | 4/1993 | Gross et al. |
| 5,237,535 A | 8/1993 | Mielke et al. |
| 5,272,669 A | 12/1993 | Samachisa et al. |
| 5,276,649 A | 1/1994 | Hoshita et al. |
| 5,287,469 A | 2/1994 | Tsuboi |
| 5,365,484 A | 11/1994 | Cleveland et al. |
| 5,388,064 A | 2/1995 | Khan |
| 5,416,646 A | 5/1995 | Shirai |
| 5,416,782 A | 5/1995 | Wells et al. |
| 5,446,854 A | 8/1995 | Khalidi et al. |
| 5,450,424 A | 9/1995 | Okugaki et al. |
| 5,469,444 A | 11/1995 | Endoh et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,532,962 A | 7/1996 | Auclair et al. |
| 5,533,190 A | 7/1996 | Binford et al. |
| 5,541,886 A | 7/1996 | Hasbun |
| 5,600,677 A | 2/1997 | Citta et al. |
| 5,638,320 A | 6/1997 | Wong et al. |
| 5,657,332 A | 8/1997 | Auclair et al. |
| 5,675,540 A | 10/1997 | Roohparvar |
| 5,682,352 A | 10/1997 | Wong et al. |
| 5,687,114 A | 11/1997 | Khan |
| 5,696,717 A | 12/1997 | Koh |
| 5,726,649 A | 3/1998 | Tamaru et al. |
| 5,726,934 A | 3/1998 | Tran et al. |
| 5,742,752 A | 4/1998 | De Koning |
| 5,748,533 A | 5/1998 | Dunlap et al. |
| 5,748,534 A | 5/1998 | Dunlap et al. |
| 5,751,637 A | 5/1998 | Chen et al. |
| 5,761,402 A | 6/1998 | Kaneda et al. |
| 5,798,966 A | 8/1998 | Keeney |
| 5,799,200 A | 8/1998 | Brant et al. |
| 5,801,985 A | 9/1998 | Roohparvar et al. |
| 5,838,832 A | 11/1998 | Barnsley |
| 5,860,106 A | 1/1999 | Domen et al. |
| 5,867,114 A | 2/1999 | Barbir |
| 5,867,428 A | 2/1999 | Ishii et al. |
| 5,867,429 A | 2/1999 | Chen et al. |
| 5,877,986 A | 3/1999 | Harari et al. |
| 5,889,937 A | 3/1999 | Tamagawa |
| 5,901,089 A | 5/1999 | Korsh et al. |
| 5,909,449 A | 6/1999 | So et al. |
| 5,912,906 A | 6/1999 | Wu et al. |
| 5,930,167 A | 7/1999 | Lee et al. |
| 5,937,424 A | 8/1999 | Leak et al. |
| 5,942,004 A | 8/1999 | Cappelletti |
| 5,946,716 A | 8/1999 | Karp et al. |
| 5,969,986 A | 10/1999 | Wong et al. |
| 5,982,668 A | 11/1999 | Ishii et al. |
| 5,991,517 A | 11/1999 | Harari et al. |
| 5,995,417 A | 11/1999 | Chen et al. |
| 6,009,014 A | 12/1999 | Hollmer et al. |
| 6,009,016 A | 12/1999 | Ishii et al. |
| 6,023,425 A | 2/2000 | Ishii et al. |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A | 10/2000 | Tanaka et al. |
| 6,134,143 A | 10/2000 | Norman |
| 6,134,631 A | 10/2000 | Jennings |
| 6,141,261 A | 10/2000 | Patti |
| 6,151,246 A | 11/2000 | So et al. |
| 6,157,573 A | 12/2000 | Ishii et al. |
| 6,166,962 A | 12/2000 | Chen et al. |
| 6,169,691 B1 | 1/2001 | Pasotti et al. |
| 6,178,466 B1 | 1/2001 | Gilbertson et al. |
| 6,185,134 B1 | 2/2001 | Tanaka et al. |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,240,458 B1 | 5/2001 | Gilbertson |
| 6,259,627 B1 | 7/2001 | Wong |
| 6,275,419 B1 | 8/2001 | Guterman et al. |
| 6,278,632 B1 | 8/2001 | Chevallier |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,307,776 B1 | 10/2001 | So et al. |
| 6,314,044 B1 | 11/2001 | Sasaki et al. |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,366,496 B1 | 4/2002 | Torelli et al. |
| 6,385,092 B1 | 5/2002 | Ishii et al. |
| 6,392,932 B1 | 5/2002 | Ishii et al. |
| 6,396,742 B1 | 5/2002 | Korsh et al. |
| 6,397,364 B1 | 5/2002 | Barkan |
| 6,405,323 B1 | 6/2002 | Lin et al. |
| 6,405,342 B1 | 6/2002 | Lee |
| 6,418,060 B1 | 7/2002 | Yong et al. |
| 6,442,585 B1 | 8/2002 | Dean et al. |
| 6,445,602 B1 | 9/2002 | Kokudo et al. |
| 6,452,838 B1 | 9/2002 | Ishii et al. |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,480,948 B1 | 11/2002 | Virajpet et al. |
| 6,490,236 B1 | 12/2002 | Fukuda et al. |
| 6,522,580 B2 | 2/2003 | Chen et al. |
| 6,525,952 B2 | 2/2003 | Araki et al. |
| 6,532,556 B1 | 3/2003 | Wong et al. |
| 6,538,922 B1 | 3/2003 | Khalid et al. |
| 6,549,464 B2 | 4/2003 | Tanaka et al. |
| 6,553,510 B1 | 4/2003 | Pekny et al. |
| 6,558,967 B1 | 5/2003 | Wong |
| 6,560,152 B1 | 5/2003 | Cernea |
| 6,567,311 B2 | 5/2003 | Ishii et al. |
| 6,577,539 B2 | 6/2003 | Iwahashi |
| 6,584,012 B2 | 6/2003 | Banks |
| 6,615,307 B1 | 9/2003 | Roohparvar |
| 6,621,739 B2 | 9/2003 | Gonzales et al. |
| 6,640,326 B1 | 10/2003 | Buckingham et al. |
| 6,643,169 B2 | 11/2003 | Rudelic et al. |
| 6,646,913 B2 | 11/2003 | Micheloni et al. |
| 6,678,192 B2 | 1/2004 | Gongwer et al. |
| 6,683,811 B2 | 1/2004 | Ishii et al. |
| 6,687,155 B2 | 2/2004 | Nagasue |
| 6,707,748 B2 | 3/2004 | Lin et al. |
| 6,708,257 B2 | 3/2004 | Bao |
| 6,714,449 B2 | 3/2004 | Khalid |
| 6,717,847 B2 | 4/2004 | Chen |
| 6,731,557 B2 | 5/2004 | Beretta |
| 6,732,250 B2 | 5/2004 | Durrant |
| 6,738,293 B1 | 5/2004 | Iwahashi |
| 6,751,766 B2 | 6/2004 | Guterman et al. |
| 6,757,193 B2 | 6/2004 | Chen et al. |
| 6,774,808 B1 | 8/2004 | Hibbs et al. |
| 6,781,877 B2 | 8/2004 | Cernea et al. |
| 6,804,805 B2 | 10/2004 | Rub |
| 6,807,095 B2 | 10/2004 | Chen et al. |
| 6,807,101 B2 | 10/2004 | Ooishi et al. |
| 6,809,964 B2 | 10/2004 | Moschopoulos et al. |
| 6,819,592 B2 | 11/2004 | Noguchi et al. |
| 6,829,167 B2 | 12/2004 | Tu et al. |
| 6,845,052 B1 | 1/2005 | Ho et al. |
| 6,851,018 B2 | 2/2005 | Wyatt et al. |

| Patent | Type | Date | Inventor |
|---|---|---|---|
| 6,851,081 | B2 | 2/2005 | Yamamoto |
| 6,856,546 | B2 | 2/2005 | Guterman et al. |
| 6,862,218 | B2 | 3/2005 | Guterman et al. |
| 6,870,767 | B2 | 3/2005 | Rudelic et al. |
| 6,870,773 | B2 | 3/2005 | Noguchi et al. |
| 6,873,552 | B2 | 3/2005 | Ishii et al. |
| 6,879,520 | B2 | 4/2005 | Hosono et al. |
| 6,882,567 | B1 | 4/2005 | Wong |
| 6,894,926 | B2 | 5/2005 | Guterman et al. |
| 6,907,497 | B2 | 6/2005 | Hosono et al. |
| 6,925,009 | B2 | 8/2005 | Noguchi et al. |
| 6,930,925 | B2 | 8/2005 | Guo et al. |
| 6,934,188 | B2 | 8/2005 | Roohparvar |
| 6,937,511 | B2 | 8/2005 | Hsu et al. |
| 6,958,938 | B2 | 10/2005 | Noguchi et al. |
| 6,963,505 | B2 | 11/2005 | Cohen |
| 6,972,993 | B2 | 12/2005 | Conley et al. |
| 6,988,175 | B2 | 1/2006 | Lasser |
| 6,992,932 | B2 | 1/2006 | Cohen |
| 6,999,344 | B2 | 2/2006 | Hosono et al. |
| 7,002,843 | B2 | 2/2006 | Guterman et al. |
| 7,006,379 | B2 * | 2/2006 | Noguchi et al. ......... 365/185.17 |
| 7,012,835 | B2 | 3/2006 | Gonzales et al. |
| 7,020,017 | B2 | 3/2006 | Chen et al. |
| 7,023,735 | B2 | 4/2006 | Ban et al. |
| 7,031,210 | B2 | 4/2006 | Park et al. |
| 7,031,214 | B2 | 4/2006 | Tran |
| 7,031,216 | B2 | 4/2006 | You |
| 7,039,846 | B2 | 5/2006 | Hewitt et al. |
| 7,042,766 | B1 | 5/2006 | Wang et al. |
| 7,054,193 | B1 | 5/2006 | Wong |
| 7,054,199 | B2 | 5/2006 | Lee et al. |
| 7,057,958 | B2 | 6/2006 | So et al. |
| 7,065,147 | B2 | 6/2006 | Ophir et al. |
| 7,068,539 | B2 | 6/2006 | Guterman et al. |
| 7,071,849 | B2 | 7/2006 | Zhang |
| 7,072,222 | B2 | 7/2006 | Ishii et al. |
| 7,079,555 | B2 | 7/2006 | Baydar et al. |
| 7,088,615 | B2 | 8/2006 | Guterman et al. |
| 7,099,194 | B2 | 8/2006 | Tu et al. |
| 7,102,924 | B2 | 9/2006 | Chen et al. |
| 7,113,432 | B2 | 9/2006 | Mokhlesi |
| 7,130,210 | B2 | 10/2006 | Bathul et al. |
| 7,139,192 | B1 | 11/2006 | Wong |
| 7,139,198 | B2 | 11/2006 | Guterman et al. |
| 7,141,891 | B2 * | 11/2006 | McNally et al. ................. 307/39 |
| 7,145,805 | B2 | 12/2006 | Ishii et al. |
| 7,151,692 | B2 | 12/2006 | Wu |
| 7,158,058 | B1 | 1/2007 | Yu |
| 7,170,781 | B2 | 1/2007 | So et al. |
| 7,170,802 | B2 | 1/2007 | Cernea et al. |
| 7,173,859 | B2 | 2/2007 | Hemink |
| 7,177,184 | B2 | 2/2007 | Chen |
| 7,177,195 | B2 | 2/2007 | Gonzales et al. |
| 7,177,199 | B2 | 2/2007 | Chen et al. |
| 7,177,200 | B2 | 2/2007 | Ronen et al. |
| 7,184,338 | B2 | 2/2007 | Nakagawa et al. |
| 7,187,195 | B2 | 3/2007 | Kim |
| 7,187,592 | B2 | 3/2007 | Guterman et al. |
| 7,190,614 | B2 | 3/2007 | Wu |
| 7,193,898 | B2 | 3/2007 | Cernea |
| 7,193,921 | B2 | 3/2007 | Choi et al. |
| 7,196,644 | B1 | 3/2007 | Anderson et al. |
| 7,196,928 | B2 | 3/2007 | Chen |
| 7,196,933 | B2 | 3/2007 | Shibata |
| 7,197,594 | B2 | 3/2007 | Raz et al. |
| 7,200,062 | B2 | 4/2007 | Kinsely et al. |
| 7,210,077 | B2 | 4/2007 | Brandenberger et al. |
| 7,221,592 | B2 | 5/2007 | Nazarian |
| 7,224,613 | B2 | 5/2007 | Chen et al. |
| 7,231,474 | B1 | 6/2007 | Helms et al. |
| 7,231,562 | B2 | 6/2007 | Ohlhoff et al. |
| 7,243,275 | B2 | 7/2007 | Gongwer et al. |
| 7,254,690 | B2 | 8/2007 | Rao |
| 7,254,763 | B2 | 8/2007 | Aadsen et al. |
| 7,257,027 | B2 | 8/2007 | Park |
| 7,259,987 | B2 | 8/2007 | Chen et al. |
| 7,266,026 | B2 | 9/2007 | Gongwer et al. |
| 7,266,069 | B2 | 9/2007 | Chu |
| 7,269,066 | B2 | 9/2007 | Nguyen et al. |
| 7,272,757 | B2 | 9/2007 | Stocken |
| 7,274,611 | B2 | 9/2007 | Roohparvar |
| 7,277,355 | B2 | 10/2007 | Tanzana |
| 7,280,398 | B1 | 10/2007 | Lee et al. |
| 7,280,409 | B2 | 10/2007 | Misumi et al. |
| 7,280,415 | B2 | 10/2007 | Hwang et al. |
| 7,283,399 | B2 | 10/2007 | Ishii et al. |
| 7,289,344 | B2 | 10/2007 | Chen |
| 7,301,807 | B2 | 11/2007 | Khalid et al. |
| 7,301,817 | B2 | 11/2007 | Li et al. |
| 7,308,525 | B2 | 12/2007 | Lasser et al. |
| 7,310,255 | B2 | 12/2007 | Chan |
| 7,310,269 | B2 | 12/2007 | Shibata |
| 7,310,271 | B2 | 12/2007 | Lee |
| 7,310,272 | B1 | 12/2007 | Mokhesi et al. |
| 7,310,347 | B2 | 12/2007 | Lasser |
| 7,312,727 | B1 | 12/2007 | Feng et al. |
| 7,321,509 | B2 | 1/2008 | Chen et al. |
| 7,328,384 | B1 | 2/2008 | Kulkarni et al. |
| 7,342,831 | B2 | 3/2008 | Mokhlesi et al. |
| 7,343,330 | B1 | 3/2008 | Boesjes et al. |
| 7,345,924 | B2 | 3/2008 | Nguyen et al. |
| 7,345,928 | B2 | 3/2008 | Li |
| 7,349,263 | B2 | 3/2008 | Kim et al. |
| 7,356,755 | B2 | 4/2008 | Fackenthal |
| 7,363,420 | B2 | 4/2008 | Lin et al. |
| 7,365,671 | B1 | 4/2008 | Anderson |
| 7,388,781 | B2 | 6/2008 | Litsyn et al. |
| 7,397,697 | B2 | 7/2008 | So et al. |
| 7,405,974 | B2 | 7/2008 | Yaoi et al. |
| 7,405,979 | B2 | 7/2008 | Ishii et al. |
| 7,408,804 | B2 | 8/2008 | Hemink et al. |
| 7,408,810 | B2 | 8/2008 | Aritome et al. |
| 7,409,473 | B2 | 8/2008 | Conley et al. |
| 7,409,623 | B2 | 8/2008 | Baker et al. |
| 7,420,847 | B2 | 9/2008 | Li |
| 7,433,231 | B2 | 10/2008 | Aritome |
| 7,433,697 | B2 | 10/2008 | Karaoguz et al. |
| 7,434,111 | B2 | 10/2008 | Sugiura et al. |
| 7,436,733 | B2 * | 10/2008 | Mokhlesi ................. 365/230.06 |
| 7,437,498 | B2 | 10/2008 | Ronen |
| 7,440,324 | B2 | 10/2008 | Mokhlesi |
| 7,440,331 | B2 | 10/2008 | Hemink |
| 7,441,067 | B2 | 10/2008 | Gorobetz et al. |
| 7,447,079 | B2 * | 11/2008 | Nguyen et al. ........... 365/185.21 |
| 7,447,970 | B2 | 11/2008 | Wu et al. |
| 7,450,421 | B2 | 11/2008 | Mokhlesi et al. |
| 7,453,737 | B2 | 11/2008 | Ha |
| 7,457,163 | B2 | 11/2008 | Hemink |
| 7,457,897 | B1 | 11/2008 | Lee et al. |
| 7,460,410 | B2 | 12/2008 | Nagai et al. |
| 7,460,412 | B2 | 12/2008 | Lee et al. |
| 7,466,592 | B2 | 12/2008 | Mitani et al. |
| 7,468,907 | B2 | 12/2008 | Kang et al. |
| 7,468,911 | B2 | 12/2008 | Lutze et al. |
| 7,469,049 | B1 | 12/2008 | Feng |
| 7,471,581 | B2 | 12/2008 | Tran et al. |
| 7,483,319 | B2 | 1/2009 | Brown |
| 7,487,329 | B2 | 2/2009 | Hepkin et al. |
| 7,487,394 | B2 | 2/2009 | Forhan et al. |
| 7,492,641 | B2 | 2/2009 | Hosono et al. |
| 7,508,710 | B2 | 3/2009 | Mokhlesi |
| 7,526,711 | B2 | 4/2009 | Orio |
| 7,539,061 | B2 | 5/2009 | Lee |
| 7,539,062 | B2 | 5/2009 | Doyle |
| 7,551,492 | B2 | 6/2009 | Kim |
| 7,558,109 | B2 | 7/2009 | Brandman et al. |
| 7,558,839 | B1 | 7/2009 | McGovern |
| 7,568,135 | B2 | 7/2009 | Cornwell et al. |
| 7,570,520 | B2 | 8/2009 | Kamei et al. |
| 7,574,555 | B2 | 8/2009 | Porat et al. |
| 7,590,002 | B2 | 9/2009 | Mokhlesi et al. |
| 7,593,259 | B2 | 9/2009 | Kim |
| 7,594,093 | B1 | 9/2009 | Kancherla |
| 7,596,707 | B1 | 9/2009 | Vemula |
| 7,609,787 | B2 | 10/2009 | Jahan et al. |
| 7,613,043 | B2 | 11/2009 | Cornwell et al. |
| 7,616,498 | B2 | 11/2009 | Mokhlesi et al. |

| | | |
|---|---|---|
| 7,619,918 B2 | 11/2009 | Aritome |
| 7,631,245 B2 | 12/2009 | Lasser |
| 7,633,798 B2 | 12/2009 | Sarin et al. |
| 7,633,802 B2 | 12/2009 | Mokhlesi |
| 7,639,532 B2 | 12/2009 | Roohparvar et al. |
| 7,644,347 B2 | 1/2010 | Alexander et al. |
| 7,656,734 B2 | 2/2010 | Thorp et al. |
| 7,660,158 B2 | 2/2010 | Aritome |
| 7,660,183 B2 | 2/2010 | Ware et al. |
| 7,661,000 B2 | 2/2010 | Ueda et al. |
| 7,661,054 B2 | 2/2010 | Huffman et al. |
| 7,665,007 B2 | 2/2010 | Yang et al. |
| 7,680,987 B1 | 3/2010 | Clark et al. |
| 7,733,712 B1 | 6/2010 | Walston et al. |
| 7,742,351 B2 | 6/2010 | Inoue et al. |
| 7,761,624 B2 | 7/2010 | Karamcheti et al. |
| 7,797,609 B2 | 9/2010 | Neuman |
| 7,810,017 B2 | 10/2010 | Radke |
| 7,848,149 B2 | 12/2010 | Gonzales et al. |
| 7,869,273 B2 | 1/2011 | Lee et al. |
| 7,885,119 B2 | 2/2011 | Li |
| 7,904,783 B2 | 3/2011 | Brandman et al. |
| 7,924,613 B1 | 4/2011 | Sommer |
| 7,925,936 B1 | 4/2011 | Sommer |
| 7,928,497 B2 | 4/2011 | Yaegashi |
| 7,929,549 B1 | 4/2011 | Talbot |
| 7,930,515 B2 | 4/2011 | Gupta et al. |
| 7,945,825 B2 | 5/2011 | Cohen et al. |
| 7,978,516 B2 | 7/2011 | Olbrich et al. |
| 7,995,388 B1 | 8/2011 | Winter et al. |
| 8,000,135 B1 | 8/2011 | Perlmutter et al. |
| 8,000,141 B1 | 8/2011 | Shalvi et al. |
| 8,014,094 B1 | 9/2011 | Jin |
| 8,037,380 B2 | 10/2011 | Cagno et al. |
| 8,040,744 B2 | 10/2011 | Gorobets et al. |
| 8,065,583 B2 | 11/2011 | Radke |
| 8,134,853 B2 * | 3/2012 | Fastow et al. .................. 365/72 |
| 8,203,888 B2 * | 6/2012 | Fukuda et al. ............ 365/185.21 |
| 8,248,851 B1 * | 8/2012 | Pio ........................... 365/185.11 |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0056064 A1 | 5/2002 | Kidorf et al. |
| 2002/0118574 A1 | 8/2002 | Gongwer et al. |
| 2002/0133684 A1 | 9/2002 | Anderson |
| 2002/0166091 A1 | 11/2002 | Kidorf et al. |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2004/0223371 A1 | 11/2004 | Roohparvar |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0030788 A1 | 2/2005 | Parkinson et al. |
| 2005/0086574 A1 | 4/2005 | Fackenthal |
| 2005/0121436 A1 | 6/2005 | Kamitani et al. |
| 2005/0144361 A1 | 6/2005 | Gonzalez et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0106972 A1 | 5/2006 | Gorobets et al. |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0190699 A1 | 8/2006 | Lee |
| 2006/0203546 A1 | 9/2006 | Lasser |
| 2006/0218359 A1 | 9/2006 | Sanders et al. |
| 2006/0221692 A1 | 10/2006 | Chen |
| 2006/0221705 A1 | 10/2006 | Hemink et al. |
| 2006/0221714 A1 | 10/2006 | Li et al. |
| 2006/0239077 A1 | 10/2006 | Park et al. |
| 2006/0239081 A1 | 10/2006 | Roohparvar |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0104211 A1 | 5/2007 | Opsasnick |
| 2007/0109845 A1 | 5/2007 | Chen |
| 2007/0109849 A1 | 5/2007 | Chen |
| 2007/0115726 A1 | 5/2007 | Cohen et al. |
| 2007/0118713 A1 | 5/2007 | Guterman et al. |
| 2007/0143378 A1 | 6/2007 | Gorobetz |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0263455 A1 | 11/2007 | Cornwell et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2007/0297234 A1 | 12/2007 | Cernea et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0089123 A1 | 4/2008 | Chae et al. |
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |

| | | | | | | |
|---|---|---|---|---|---|---|
| 2008/0123420 A1 | 5/2008 | Brandman et al. | | 2010/0220510 A1 | 9/2010 | Shalvi |
| 2008/0123426 A1 | 5/2008 | Lutze et al. | | 2010/0250836 A1 | 9/2010 | Sokolov et al. |
| 2008/0126686 A1 | 5/2008 | Sokolov et al. | | 2010/0287217 A1 | 11/2010 | Borchers et al. |
| 2008/0130341 A1 | 6/2008 | Shalvi et al. | | 2011/0010489 A1 | 1/2011 | Yeh |
| 2008/0148115 A1 | 6/2008 | Sokolov et al. | | 2011/0060969 A1 | 3/2011 | Ramamoorthy et al. |
| 2008/0151618 A1 | 6/2008 | Sharon et al. | | 2011/0066793 A1 | 3/2011 | Burd |
| 2008/0151667 A1 | 6/2008 | Miu et al. | | 2011/0075482 A1 | 3/2011 | Shepard et al. |
| 2008/0158958 A1 | 7/2008 | Sokolov et al. | | 2011/0107049 A1 | 5/2011 | Kwon et al. |
| 2008/0181001 A1 | 7/2008 | Shalvi | | 2011/0149657 A1 | 6/2011 | Haratsch et al. |
| 2008/0198650 A1 | 8/2008 | Shalvi et al. | | 2011/0199823 A1 | 8/2011 | Bar-Or et al. |
| 2008/0198654 A1 | 8/2008 | Toda | | 2011/0302354 A1 | 12/2011 | Miller |
| 2008/0209116 A1 | 8/2008 | Caulkins | | | | |
| 2008/0209304 A1 | 8/2008 | Winarski et al. | | FOREIGN PATENT DOCUMENTS | | |
| 2008/0215798 A1 | 9/2008 | Sharon et al. | | EP | 1605509 A1 | 12/2005 |
| 2008/0219050 A1 | 9/2008 | Shalvi et al. | | WO | 9610256 A1 | 4/1996 |
| 2008/0239093 A1 | 10/2008 | Easwar et al. | | WO | 9828745 A1 | 7/1998 |
| 2008/0239812 A1 | 10/2008 | Abiko et al. | | WO | 02100112 A1 | 12/2002 |
| 2008/0253188 A1 | 10/2008 | Aritome | | WO | 03100791 A1 | 12/2003 |
| 2008/0263262 A1 | 10/2008 | Sokolov et al. | | WO | 2007046084 A2 | 4/2007 |
| 2008/0263676 A1 | 10/2008 | Mo et al. | | WO | 2007132452 A2 | 11/2007 |
| 2008/0270730 A1 | 10/2008 | Lasser et al. | | WO | 2007132453 A2 | 11/2007 |
| 2008/0282106 A1 | 11/2008 | Shalvi et al. | | WO | 2007132456 A2 | 11/2007 |
| 2008/0288714 A1 | 11/2008 | Salomon et al. | | WO | 2007132457 A2 | 11/2007 |
| 2009/0013233 A1 | 1/2009 | Radke | | WO | 2007132458 A2 | 11/2007 |
| 2009/0024905 A1 | 1/2009 | Shalvi et al. | | WO | 2007146010 A2 | 12/2007 |
| 2009/0034337 A1 | 2/2009 | Aritome | | WO | 2008026203 A2 | 3/2008 |
| 2009/0043831 A1 | 2/2009 | Antonopoulos et al. | | WO | 2008053472 A2 | 5/2008 |
| 2009/0043951 A1 | 2/2009 | Shalvi et al. | | WO | 2008053473 A2 | 5/2008 |
| 2009/0049234 A1 | 2/2009 | Oh et al. | | WO | 2008068747 A2 | 6/2008 |
| 2009/0073762 A1 | 3/2009 | Lee et al. | | WO | 2008077284 A1 | 7/2008 |
| 2009/0086542 A1 | 4/2009 | Lee et al. | | WO | 2008083131 A2 | 7/2008 |
| 2009/0089484 A1 | 4/2009 | Chu | | WO | 2008099958 A1 | 8/2008 |
| 2009/0091979 A1 | 4/2009 | Shalvi | | WO | 2008111058 A2 | 9/2008 |
| 2009/0094930 A1 | 4/2009 | Schwoerer | | WO | 2008124760 A2 | 10/2008 |
| 2009/0106485 A1 | 4/2009 | Anholt | | WO | 2008139441 A2 | 11/2008 |
| 2009/0112949 A1 | 4/2009 | Ergan et al. | | WO | 2009037691 A2 | 3/2009 |
| 2009/0132755 A1 | 5/2009 | Radke | | WO | 2009037697 A2 | 3/2009 |
| 2009/0144600 A1 | 6/2009 | Perlmutter et al. | | WO | 2009038961 A2 | 3/2009 |
| 2009/0150894 A1 | 6/2009 | Huang et al. | | WO | 2009050703 A2 | 4/2009 |
| 2009/0157950 A1 | 6/2009 | Selinger | | WO | 2009053961 A2 | 4/2009 |
| 2009/0157964 A1 | 6/2009 | Kasorla et al. | | WO | 2009053962 A2 | 4/2009 |
| 2009/0158126 A1 | 6/2009 | Perlmutter et al. | | WO | 2009053963 A2 | 4/2009 |
| 2009/0168524 A1 | 7/2009 | Golov et al. | | WO | 2009063450 A2 | 5/2009 |
| 2009/0172257 A1 | 7/2009 | Prins et al. | | WO | 2009072100 A2 | 6/2009 |
| 2009/0172261 A1 | 7/2009 | Prins et al. | | WO | 2009072101 A2 | 6/2009 |
| 2009/0193184 A1 | 7/2009 | Yu et al. | | WO | 2009072102 A2 | 6/2009 |
| 2009/0199074 A1 | 8/2009 | Sommer et al. | | WO | 2009072103 A2 | 6/2009 |
| 2009/0204824 A1 | 8/2009 | Lin et al. | | WO | 2009072104 A2 | 6/2009 |
| 2009/0204872 A1 | 8/2009 | Yu et al. | | WO | 2009072105 A2 | 6/2009 |
| 2009/0213653 A1 | 8/2009 | Perlmutter et al. | | WO | 2009074978 A2 | 6/2009 |
| 2009/0213654 A1 | 8/2009 | Perlmutter et al. | | WO | 2009074979 A2 | 6/2009 |
| 2009/0225595 A1 | 9/2009 | Kim | | WO | 2009078006 A2 | 6/2009 |
| 2009/0228761 A1 | 9/2009 | Perlmutter et al. | | WO | 2009095902 A2 | 8/2009 |
| 2009/0240872 A1 | 9/2009 | Perlmutter et al. | | WO | 2011024015 A1 | 3/2011 |
| 2009/0265509 A1 | 10/2009 | Klein | | | | |
| 2009/0300227 A1 | 12/2009 | Nochimowski et al. | | OTHER PUBLICATIONS | | |
| 2009/0323412 A1 | 12/2009 | Mokhlesi et al. | | | | |
| 2009/0327608 A1 | 12/2009 | Eschmann | | | | |
| 2010/0017650 A1 | 1/2010 | Chin et al. | | | | |
| 2010/0034022 A1 | 2/2010 | Dutta et al. | | | | |
| 2010/0057976 A1 | 3/2010 | Lasser | | | | |
| 2010/0061151 A1 | 3/2010 | Miwa et al. | | | | |
| 2010/0082883 A1 | 4/2010 | Chen et al. | | | | |
| 2010/0083247 A1 | 4/2010 | Kanevsky et al. | | | | |
| 2010/0110580 A1 | 5/2010 | Takashima | | | | |
| 2010/0124088 A1 | 5/2010 | Shalvi et al. | | | | |
| 2010/0131697 A1 | 5/2010 | Alrod et al. | | | | |
| 2010/0131827 A1 | 5/2010 | Sokolov et al. | | | | |
| 2010/0142268 A1 | 6/2010 | Aritome | | | | |
| 2010/0142277 A1 | 6/2010 | Yang et al. | | | | |
| 2010/0157675 A1 | 6/2010 | Shalvi et al. | | | | |
| 2010/0165689 A1 | 7/2010 | Rotbard et al. | | | | |
| 2010/0169547 A1 | 7/2010 | Ou | | | | |
| 2010/0169743 A1 | 7/2010 | Vogan et al. | | | | |
| 2010/0174847 A1 | 7/2010 | Paley et al. | | | | |
| 2010/0195390 A1 | 8/2010 | Shalvi | | | | |
| 2010/0199150 A1 | 8/2010 | Shalvi et al. | | | | |
| 2010/0211803 A1 | 8/2010 | Lablans | | | | |
| 2010/0220509 A1 | 9/2010 | Sokolov et al. | | | | |

U.S. Appl. No. 12/332,368 Office Action dated Nov. 10, 2011.
U.S. Appl. No. 12/063,544 Office Action dated Dec. 14, 2011.
U.S. Appl. No. 12/186,867 Office Action dated Jan. 17, 2012.
U.S. Appl. No. 12/119,069 Office Action dated Nov. 14, 2011.
U.S. Appl. No. 12/037,487 Office Action dated Jan. 3, 2012.
U.S. Appl. No. 11/995,812 Office Action dated Oct. 28, 2011.
U.S. Appl. No. 12/551,567 Office Action dated Oct. 27, 2011.
U.S. Appl. No. 12/618,732 Office Action dated Nov. 4, 2011.
U.S. Appl. No. 12/649,382 Office Action dated Jan. 6, 2012.
Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-5, 2007.
U.S. Appl. No. 13/284,913, filed Oct. 30, 2011.
U.S. Appl. No. 13/338,335, filed Dec. 28, 2011.
U.S. Appl. No. 13/355,536, filed Jan. 22, 2012.
U.S. Appl. No. 13/284,909, filed Oct. 30, 2011.
U.S. Appl. No. 12/323,544 Official Action dated Mar. 9, 2012.
Chinese Patent Application # 200780026181.3 Official Action dated Mar. 7, 2012.

Chinese Patent Application # 200780026094.8 Official Action dated Feb. 2, 2012.
U.S. Appl. No. 12/332,370 Official Action dated Mar. 8, 2012.
U.S. Appl. No. 12/579,432 Official Action dated Feb. 29, 2012.
U.S. Appl. No. 12/522,175 Official Action dated Mar. 27, 2012.
U.S. Appl. No. 12/607,085 Official Action dated Mar. 28, 2012.
Budilovsky et al., "Prototyping a High-Performance Low-Cost Solid-State Disk", SYSTOR—The 4th Annual International Systems and Storage Conference, Haifa, Israel, May 30-Jun. 1, 2011.
NVM Express Protocol, "NVM Express", Revision 1.0b, Jul. 12, 2011.
SCSI Protocol, "Information Technology—SCSI Architecture Model-5 (SAM-5)", INCITS document T10/2104-D, revision 01, Jan. 28, 2009.
SAS Protocol, "Information Technology—Serial Attached SCSI-2 (SAS-2)", INCITS document T10/1760-D, revision 15a, Feb. 22, 2009.
Agrell et al., "Closest Point Search in Lattices", IEEE Transactions on Information Theory, vol. 48, No. 8, pp. 2201-2214, Aug. 2002.
Ankolekar et al., "Multibit Error-Correction Methods for Latency-Constrained Flash Memory Systems", IEEE Transactions on Device and Materials Reliability, vol. 10, No. 1, pp. 33-39, Mar. 2010.
Berman et al., "Mitigating Inter-Cell Coupling Effects in MLC NAND Flash via Constrained Coding", Flash Memory Summit, Santa Clara, USA, Aug. 19, 2010.
Bez et al., "Introduction to Flash memory", Proceedings of the IEEE, vol. 91, No. 4, pp. 489-502, Apr. 2003.
Blahut, R.E., "Theory and Practice of Error Control Codes," Addison-Wesley, May 1984, section 3.2, pp. 47-48.
Conway et al., "Sphere Packings, Lattices and Groups", 3rd edition, chapter 4, pp. 94-135, Springer, New York, US 1998.
Chang, L., "Hybrid Solid State Disks: Combining Heterogeneous NAND Flash in Large SSDs", ASPDAC, Jan. 2008.
Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.
Compaq et al., "Universal Serial Bus Specification", revision 2.0, Apr. 27, 2000.
Databahn™, "Flash memory controller IP", Denali Software, Inc., 1994 https://www.denali.com/en/products/databahn_flash.jsp.
Datalight, Inc., "FlashFX Pro 3.1 High Performance Flash Manager for Rapid Development of Reliable Products", Nov. 16, 2006.
Duann, N., Silicon Motion Presentation "SLC & MLC Hybrid", Flash Memory Summit, Santa Clara, USA, Aug. 2008.
Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.
Eitan et al., "Multilevel Flash Cells and their Trade-Offs", Proceedings of the 1996 IEEE International Electron Devices Meeting (IEDM), pp. 169-172, New York, USA 1996.
Engh et al., "A self adaptive programming method with 5 mV accuracy for multi-level storage in FLASH", pp. 115-118, Proceedings of the IEEE 2002 Custom Integrated Circuits Conference, May 12-15, 2002.
Engineering Windows 7, "Support and Q&A for Solid-State Drives", e7blog, May 5, 2009.
Goodman et al., "On-Chip ECC for Multi-Level Random Access Memories," Proceedings of the IEEE/CAM Information Theory Workshop, Ithaca, USA, Jun. 25-29, 1989.
Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.
Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.
Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.

Hong et al., "NAND Flash-based Disk Cache Using SLC/MLC Combined Flash Memory", 2010 International Workshop on Storage Network Architecture and Parallel I/Os, pp. 21-30, USA, May 3, 2010.
Horstein, "On the Design of Signals for Sequential and Nonsequential Detection Systems with Feedback," IEEE Transactions on Information Theory IT-12:4 (Oct. 1966), pp. 448-455.
How to Resolve Bad Super Block: Magic Number Wrong"in BSD", Free Online Articles Director Article Base, posted Sep. 5, 2009.
Huffman, A., "Non-Volatile Memory Host Controller Interface (NVMHCI)", Specification 1.0, Apr. 14, 2008.
JEDEC Standard JESD84-C44, "Embedded MultiMediaCard (eMMC) Mechanical Standard, with Optional Reset Signal", Jedec Solid State Technology Association, USA, Jul. 2009.
JEDEC, "UFS Specification", version 0.1, Nov. 11, 2009.
Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.
Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.
Kawaguchi et al. 1995. A flash-memory based file system. In Proceedings of the USENIX 1995 Technical Conference, New Orleans, Louisiana. 155-164.
Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.
Lee et al., "Effects of Floating Gate Interference on NAND Flash Memory Cell Operation", IEEE Electron Device Letters, vol. 23, No. 5, pp. 264-266, May 2002.
Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.
Mielke et al., "Recovery Effects in the Distributed Cycling of Flash Memories", IEEE 44th Annual International Reliability Physics Symposium, pp. 29-35, San Jose, USA, Mar. 2006.
Micron Technology Inc., "Memory Management in NAND Flash Arrays", Technical Note, year 2005.
Numonyx, "M25PE16: 16-Mbit, page-erasable serial flash memory with byte-alterability, 75 MHz SPI bus, standard pinout", Apr. 2008.
ONFI, "Open NAND Flash Interface Specification," revision 1.0, Dec. 28, 2006.
Panchbhai et al., "Improving Reliability of NAND Based Flash Memory Using Hybrid SLC/MLC Device", Project Proposal for CSci 8980—Advanced Storage Systems, University of Minnesota, USA, Spring 2009.
Park et al., "Sub-Grouped Superblock Management for High-Performance Flash Storages", IEICE Electronics Express, vol. 6, No. 6, pp. 297-303, Mar. 25, 2009.
Phison Electronics Corporation, "PS8000 Controller Specification (for SD Card)", revision 1.2, Document No. S-07018, Mar. 28, 2007.
Shalvi, et al., "Signal Codes," Proceedings of the 2003 IEEE Information Theory Workshop (ITW'2003), Paris, France, Mar. 31-Apr. 4, 2003.
SD Group and SD Card Association, "SD Specifications Part 1 Physical Layer Specification", version 3.01, draft 1.00, Nov. 9, 2009.
Serial ATA International Organization, "Serial ATA Revision 3.0 Specification", Jun. 2, 2009.
Shiozaki, A., "Adaptive Type-II Hybrid Broadcast ARQ System", IEEE Transactions on Communications, vol. 44, Issue 4, pp. 420-422, Apr. 1996.
Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.
ST Microelectronics, "Bad Block Management in NAND Flash Memories", Application note AN-1819, Geneva, Switzerland, May 2004.
ST Microelectronics, "Wear Leveling in Single Level Cell NAND Flash Memories," Application note AN-1822 Geneva, Switzerland, Feb. 2007.

Super User Forums, "SD Card Failure, can't read superblock", posted Aug. 8, 2010.

Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.

Takeuchi et al., "A Multipage Cell Architecture for High-Speed Programming Multilevel NAND Flash Memories", IEEE Journal of Solid State Circuits, vol. 33, No. 8, Aug. 1998.

Ubuntu Forums, "Memory Stick Failed IO Superblock", posted Nov. 11, 2009.

Wei, L., "Trellis-Coded Modulation With Multidimensional Constellations", IEEE Transactions on Information Theory, vol. IT-33, No. 4, pp. 483-501, Jul. 1987.

Wu et al., "eNVy: A non-Volatile, Main Memory Storage System", Proceedings of the 6th International Conference on Architectural support for programming languages and operating systems, pp. 86-87, San Jose, USA, 1994.

International Application PCT/IL2007/000575 Search Report dated May 30, 2008.
International Application PCT/IL2007/000576 Search Report dated Jul. 7, 2008.
International Application PCT/IL2007/000579 Search report dated Jul. 3, 2008.
International Application PCT/IL2007/000580 Search Report dated Sep. 11, 2008.
International Application PCT/IL2007/000581 Search Report dated Aug. 25, 2008.
International Application PCT/IL2007/001059 Search report dated Aug. 7, 2008.
International Application PCT/IL2007/001315 search report dated Aug. 7, 2008.
International Application PCT/IL2007/001316 Search report dated Jul. 22, 2008.
International Application PCT/IL2007/001488 Search report dated Jun. 20, 2008.
International Application PCT/IL2008/000329 Search report dated Nov. 25, 2008.
International Application PCT/IL2008/000519 Search report dated Nov. 20, 2008.
International Application PCT/IL2008/001188 Search Report dated Jan. 28, 2009.
International Application PCT/IL2008/001356 Search Report dated Feb. 3, 2009.
International Application PCT/IL2008/001446 Search report dated Feb. 20, 2009.
U.S. Appl. No. 11/949,135 Official Action dated Oct. 2, 2009.
U.S. Appl. No. 12/019,011 Official Action dated Nov. 20, 2009.
U.S. Appl. No. 11/957,970 Official Action dated May 20, 2010.
U.S. Appl. No. 12/171,797 Official Action dated Aug. 25, 2010.
U.S. Appl. No. 11/945,575 Official Action dated Aug. 24, 2010.
U.S. Appl. No. 12/497,707 Official Action dated Sep. 15, 2010.
U.S. Appl. No. 11/995,801 Official Action dated Oct. 15, 2010.
U.S. Appl. No. 12/045,520 Official Action dated Nov. 16, 2010.
U.S. Appl. No. 12/388,528 Official Action dated Nov. 29, 2010.
U.S. Appl. No. 11/995,814 Official Action dated Dec. 17, 2010.
U.S. Appl. No. 12/251,471 Official Action dated Jan. 3, 2011.
U.S. Appl. No. 12/534,898 Official Action dated Mar. 23, 2011.
Chinese Application # 200780026181.3 Official Action dated Apr. 8, 2011.
U.S. Appl. No. 12/178,318 Official Action dated May 31, 2011.
U.S. Appl. No. 11/995,813 Official Action dated Jun. 16, 2011.
U.S. Appl. No. 12/344,233 Official Action dated Jun. 24, 2011.
Chinese Patent Application # 200780040493.X Official Action dated Jun. 15, 2011.
U.S. Appl. No. 12/405,275 Official Action dated Jul. 29, 2011.
U.S. Appl. No. 12/649,360 Official Action dated Aug. 9, 2011.
U.S. Appl. No. 13/114,049 Official Action dated Sep. 12, 2011.
U.S. Appl. No. 12/037,487 Official Action dated Oct. 3, 2011.
U.S. Appl. No. 12/534,893, filed Aug. 4, 2009.
U.S. Appl. No. 12/551,583, filed Sep. 1, 2009.
U.S. Appl. No. 12/551,567, filed Sep. 1, 2009.
U.S. Appl. No. 12/579,430, filed Oct. 15, 2009.
U.S. Appl. No. 12/579,432, filed Oct. 15, 2009.
U.S. Appl. No. 12/607,078, filed Oct. 28, 2009.
U.S. Appl. No. 12/607,085, filed Oct. 28, 2009.
U.S. Appl. No. 12/649,358, filed Dec. 30, 2009.
U.S. Appl. No. 12/649,360, filed Dec. 30, 2009.
U.S. Appl. No. 12/688,883, filed Jan. 17, 2010.
U.S. Appl. No. 12/728,296, filed Mar. 22, 2010.
U.S. Appl. No. 12/758,003, filed Apr. 11, 2010.
U.S. Appl. No. 12/880,101, filed Sep. 12, 2010.
U.S. Appl. No. 12/890,724, filed Sep. 27, 2010.
U.S. Appl. No. 12/822,207, filed Jun. 24, 2010.
U.S. Appl. No. 12/987,174, filed Jan. 10, 2011.
U.S. Appl. No. 12/987,175, filed Jan. 10, 2011.
U.S. Appl. No. 12/963,649, filed Dec. 9, 2010.
U.S. Appl. No. 13/021,754, filed Feb. 6, 2011.
U.S. Appl. No. 13/047,822, filed Mar. 15, 2011.
U.S. Appl. No. 13/069,406, filed Mar. 23, 2011.
U.S. Appl. No. 13/088,361, filed Apr. 17, 2011.
U.S. Appl. No. 13/114,049, filed May 24, 2011.
U.S. Appl. No. 13/170,202, filed Jun. 28, 2011.
U.S. Appl. No. 13/171,467, filed Jun. 29, 2011.
U.S. Appl. No. 13/176,761, filed Jul. 6, 2011.
U.S. Appl. No. 13/192,495, filed Jul. 28, 2011.
U.S. Appl. No. 13/192,501, filed Jul. 28, 2011.
U.S. Appl. No. 13/192,504, filed Jul. 28, 2011.
U.S. Appl. No. 13/192,852, filed Aug. 2, 2011.
U.S. Appl. No. 13/231,963, filed Sep. 14, 2011.
U.S. Appl. No. 13/239,408, filed Sep. 22, 2011.
U.S. Appl. No. 13/239,411, filed Sep. 22, 2011.
US 7,161,836, 01/2007, Wan et al. (withdrawn)

* cited by examiner

MEMORY DEVICE WITH REDUCED SENSE TIME READOUT

CROSS-REFERENCE TO RELATED APPLICATIONS

This application is a continuation in part of U.S. patent application Ser. No. 12/405,275, filed Mar. 17, 2009, which claims the benefit of U.S. Provisional Patent Application 61/037,327, filed Mar. 18, 2008, and U.S. Provisional Patent Application 61/119,929, filed Dec. 4, 2008. The disclosures of all these related applications are incorporated herein by reference.

FIELD OF THE INVENTION

The present invention relates generally to memory devices, and particularly to methods and systems for reading data from analog memory cells.

BACKGROUND OF THE INVENTION

Several types of memory devices, such as Flash memories, use arrays of analog memory cells for storing data. Each analog memory cell holds a certain level of a given physical quantity such as an electrical charge or voltage, which represents the data stored in the cell. The levels of this physical quantity are also referred to as storage values or analog values. In Flash memories, for example, each analog memory cell holds a certain amount of electrical charge. The range of possible analog values is typically divided into regions, each region corresponding to a programming state that represents one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the $24^{th}$ International Conference on Microelectronics (MIEL), Nis, Serbia and Montenegro, May 16-19, 2004, volume 1, pages 377-384, which is incorporated herein by reference.

SUMMARY OF THE INVENTION

An embodiment that is described herein provides a method for data storage. The method includes providing at least first and second readout configurations for reading storage values from analog memory cells, such that the first readout configuration reads the storage values with a first sense time and the second readout configuration reads the storage values with a second sense time, shorter than the first sense time. A condition is evaluated with respect to a read operation that is to be performed over a group of the memory cells. One of the first and second readout configurations is selected responsively to the evaluated condition. The storage values are read from the group of the memory cells using the selected readout configuration.

In some embodiments, the memory cells in the group belong to respective bit lines, the first readout configuration sets at least one of the bit lines to have a first conductivity, and the second readout configuration sets the at least one of the bit lines to have a second conductivity, greater than the first conductivity.

In an embodiment, the memory cells in the group belong to a word line selected from among multiple word lines, the first readout configuration applies first pass voltages to the word lines other than the selected word lines while reading the group of memory cells, and the second readout configuration applies second pass voltages to the word lines other than the selected word lines, such that at least one of the second pass voltages is higher than a corresponding one of the first pass voltages.

In a disclosed embodiment, the first readout configuration reads the storage values using a first set of read thresholds, and the second readout configuration reads the storage values using a second set of read thresholds, such that at least one of the second read thresholds is higher than a corresponding one of the first read thresholds.

In another embodiment, the memory cells in the group belong to a word line in a memory block that includes multiple word lines, and evaluating the condition includes assessing a number of the word lines in the memory block that are programmed with data. In yet another embodiment, the first readout configuration reads the storage values with a first accuracy, and the second readout configuration reads the storage values with a second accuracy that is coarser than the first accuracy.

In some embodiments, evaluating the condition includes assessing a wear level of the group of the memory cells. In another embodiment, evaluating the condition and selecting the one of the readout configurations include selecting the second readout configuration responsively to determining that the read operation reads the storage values from potentially-interfering memory cells in an interference cancellation process. In yet another embodiment, evaluating the condition and selecting the one of the readout configurations include selecting the second readout configuration responsively to determining that the read operation verifies the storage values that were written into the given group of the memory cells.

In an example embodiment, each of the memory cells in the group stores at least first and second bits, and evaluating the condition and selecting the one of the readout configurations include selecting the second readout configuration responsively to determining that the read operation reads the first bits from the memory cells, and selecting the first readout configuration responsively to determining that the read operation reads the second bits from the memory cells. In another embodiment, evaluating the condition and selecting the one of the readout configurations include selecting the second readout configuration responsively to determining that the read operation is used for estimating a statistical distribution of the storage values that were written into the given group of the memory cells.

In some embodiments, the storage values represent stored data, and evaluating the condition and selecting the one of the readout configurations include making an attempt to read the storage values from the memory cells in the group using the second readout configuration and to reconstruct the stored data from the read storage values, and selecting the first readout configuration upon a failure of the attempt. In an embodiment, the stored data is encoded with an Error Correction Code (ECC), and making the attempt comprises decoding the ECC. In a disclosed embodiment, the method includes re-attempting to reconstruct the stored data using both the storage values read by the first readout configuration and the storage values read using the second readout configuration.

There is additionally provided, in accordance with an embodiment of the present invention, apparatus for data storage including a plurality of analog memory cells and circuitry. The circuitry is configured to evaluate a condition with respect to a read operation that is to be performed over a group of the memory cells, to select, responsively to the evaluated condition, between at least first and second readout configurations for reading storage values from the analog memory cells, such that the first readout configuration reads the storage values with a first sense time and the second readout configuration reads the storage values at a second sense time that is shorter than the first sense time, and to read the storage values from the group of the memory cells using the selected readout configuration.

There is also provided, in accordance with an embodiment of the present invention, apparatus for data storage including an interface and circuitry. The interface is configured to communicate with a memory that includes a plurality of analog memory cells. The circuitry is configured to evaluate a condition with respect to a read operation that is to be performed over a group of the memory cells, to select, responsively to the evaluated condition, between at least first and second readout configurations for reading storage values from the analog memory cells, such that the first readout configuration reads the storage values with a first sense time and the second readout configuration reads the storage values at a second sense time that is shorter than the first sense time, and to read the storage values from the group of the memory cells using the selected readout configuration.

The present invention will be more fully understood from the following detailed description of the embodiments thereof, taken together with the drawings in which:

DETAILED DESCRIPTION OF EMBODIMENTS

Overview

Data is typically stored in analog memory cells by programming the cells with certain storage values (e.g., threshold voltages) that represent the data. The data is retrieved by reading the storage values from the cells. Usually, a trade-off exists between the accuracy with which the storage values are read and the time needed to read them. Highly-accurate read operations tend to be relatively long and may limit the overall data retrieval speed.

In practice, however, highly-accurate readout is not always mandatory. Some readout tasks can be carried out successfully with reduced accuracy, and therefore with higher speed. Reduced accuracy can be sufficient, for example, when the memory cells are at the beginning of their life cycle and thus have gone through only few programming and erasure cycles. As another example, when canceling interference in given memory cells based on the storage values of neighboring cells, the given cells are typically read with high accuracy. The neighboring cells, however, can often be read with lower accuracy with little or no degradation in cancellation performance.

As yet another example, when programming the cells using a Program and Verify (P&V) process, the programmed storage values can be verified with a lower accuracy than the accuracy used for data retrieval. Read operations for estimating the statistical distribution of the storage values (e.g., for adjusting read thresholds) can often be performed with lower accuracy, as well.

Embodiments of the present invention that are described hereinbelow provide improved methods and systems for reading data from analog memory cells. These methods and systems use multiple readout configurations having different sense times. For a memory cell belonging to a certain bit line, the sense time used for reading the memory cell is defined as the time duration over which the bit line voltage or current is integrated.

Typically, in preparation for reading the storage values from a group of analog memory cells, a condition related to the read operation is evaluated. An appropriate readout configuration is selected from among the available readout configurations based on the evaluated condition. The storage values are read using the selected readout configuration. The condition may depend, for example, on the age or wear level of the memory cells to be read, on whether the purpose of the readout operation is to retrieve data, to estimate interference, to verify a previous programming operation or to estimate the storage value statistics.

Several example techniques of implementing readout configurations having different sense times are described herein. Some of these techniques modify the electrical conductivity of the bit lines to which the read memory cells belong. When the bit line conductivity is improved (i.e., increased—bit line resistance reduced), the bit line current increases and readout can be performed with a shorter sense time. In practice, however, improving the bit line conductivity may degrade other system performance measures, and therefore the improvement is performed only selectively.

Typically, the memory cells in the group that is to be read with a given readout configuration belong to a certain selected word line in a memory block that includes multiple word lines. In some embodiments, the group of memory cells is read by sensing the bit lines while applying a read voltage to the selected word line and certain pass voltages to the other word lines. In some embodiments, the readout configurations differ from one another in at least one of the pass voltages that are applied to the unselected word lines. By increasing the pass voltage, the bit line conductivity can be improved and the sense time shortened.

In another embodiment, the sense time is set based on the number of word lines in the memory block that are already programmed with data. When the memory block has only a few programmed word lines, the bit line conductivity is typically better since a large number of the memory cells along the bit line are erased. In this case, a shorter sense time can typically be used. When a larger number of word lines are programmed, the bit line conductivity is typically poorer, and a longer sense time may be needed to achieve reliable readout.

Typically, the memory cells are read by comparing their storage values to one or more read thresholds. In some embodiments, the readout configurations differ from one another in at least one of the read threshold positions. By increasing a given read threshold, possibly at the expense of higher read error probability, the bit line conductivity can be improved and the sense time shortened.

When using the methods and systems described herein, some readout tasks (e.g., tasks that require high accuracy) are performed with a longer sense time. Other readout tasks, or when conditions permit, are carried out with a shorter sense time. Thus, the disclosed methods provide a considerable increase in average readout speed from analog memory cells, with little or no degradation in other performance measures.

System Description

Figure 1:
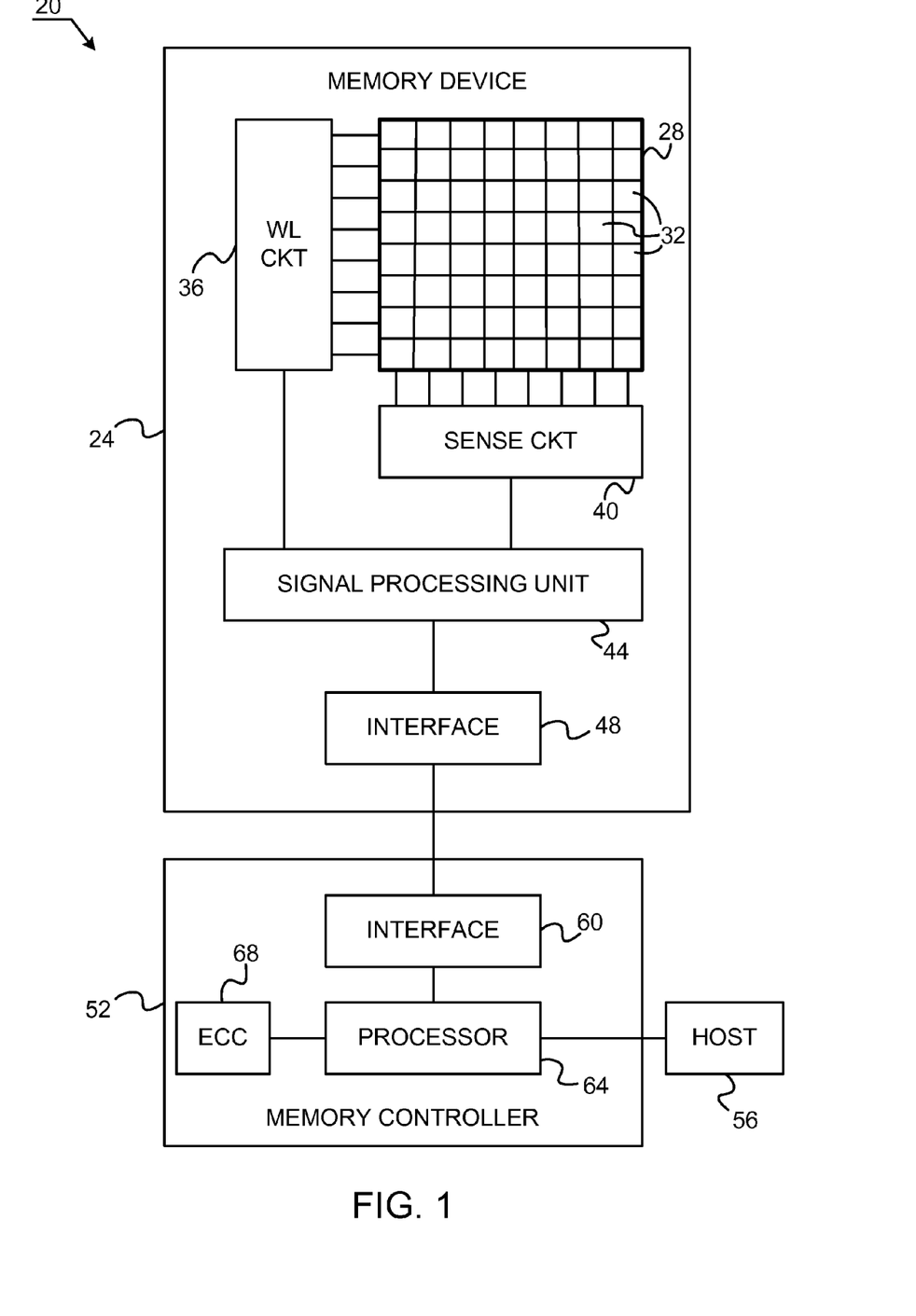
FIG. 1 is a block diagram that schematically illustrates a memory system, in accordance with an embodiment of the present invention.

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in a memory cell array 28. The memory cell array comprises multiple analog memory cells 32. Memory device and memory controller 52 may support multiple read commands, which read memory cells 32 at different accuracy levels and have different execution times. The use of these multiple read commands is addressed in detail hereinbelow. Additionally or alternatively, memory device 24 and memory controller 52 may support multiple readout configurations having different sense times. In some embodiments, the memory device and memory controller communicate with each other using a dedicated command interface in order to implement the multiple read commands or configurations defined herein.

In the context of the present patent application and in the claims, the term "analog memory cell" is used to describe any memory cell that holds a continuous, analog level of a physical quantity, such as an electrical voltage or charge. Array 28 may comprise analog memory cells of any kind, such as, for example, NAND, NOR and CTF Flash cells, PCM, NROM, FRAM, MRAM and DRAM cells. Memory cells 32 may comprise Single-Level Cells (SLC) or Multi-Level Cells (MLC, also referred to as multi-bit cells).

Memory cells 32 of array 28 are typically arranged in a grid having multiple rows and columns, commonly referred to as word lines and bit lines, respectively. Cells are typically erased in groups of word lines that are referred to as erasure blocks. In some embodiments, a given memory device comprises multiple memory cell arrays, which may be fabricated on separate dies.

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming states are selected from a finite set of possible states, and each state corresponds to a certain nominal storage value. For example, a 2 bit/cell MLC can be programmed to assume one of four possible programming states by writing one of four possible nominal storage values to the cell.

Memory device 24 comprises Reading/Writing (R/W) circuitry, which converts data for storage in the memory device to storage values and writes them into memory cells 32. In alternative embodiments, the R/W circuitry does not perform the conversion, but is provided with voltage samples, i.e., with the storage values for storage in the cells. When reading data out of array 28, the R/W circuitry converts the storage values of memory cells 32 into digital samples having a resolution of one or more bits. The R/W circuitry typically reads data from cells 32 by comparing the storage values of the cells to one or more read thresholds. Data is typically written to and read from the memory cells in groups that are referred to as pages. In some embodiments, the R/W circuitry can erase a group of cells 32 by applying one or more negative erasure pulses to the cells.

In the present example, the R/W circuitry comprises Word Line (WL) circuitry 36 and sense circuitry 40. The WL circuitry is connected to the word lines of array 28, and the sense circuitry is connected to the bit lines of the array. Among other tasks, WL circuitry 36 applies appropriate bias voltages to the different word lines during read operations, and applies appropriate programming pulses to word lines during programming operations. Sense circuitry 40, among other functions, senses the voltages or currents of the bit lines during read operations.

The R/W circuitry typically reads a group of memory cells 32 along a certain word line simultaneously. In a typical read operation, WL circuitry 36 applies the appropriate bias voltages to the read word line and to the other word lines in the same erasure block. Sense circuitry 40 senses the voltage or current of each bit line. The sensed voltage or current of a given bit line is indicative of the storage value of the memory cell that belongs to this bit line and to the read word line. The sense circuitry typically compares the sensed bit line voltages or currents to one or more read thresholds, and outputs the comparison results.

In some embodiments, memory device 24 comprises a signal processing unit 44, which applies various signal processing mechanisms to the read and/or programmed data or storage values. In particular, unit 44 may apply signal processing mechanisms that enhance the accuracy of reading the storage values from memory cells 32, such as interference cancellation or read threshold adaptation. The use of these mechanisms is addressed in greater detail below. Signal processing unit 44 communicates with WL circuitry 36 and with sense circuitry 40. Additionally, the signal processing circuitry communicates with elements external to device 24 via an interface 48.

The storage and retrieval of data in and out of memory device 24 is performed by a memory controller 52. Controller 52 comprises an interface 60 for communicating with device 24, and a processor 64 that carries out the memory control functions described herein. In some embodiments, memory controller 52 comprises an Error Correction Code (ECC) unit 68, which encodes the data for storage using a suitable ECC, and decodes the ECC of data read from the memory device. In some embodiments, controller 52 produces the storage values for storing in the memory cells and provides these values to device 24. Alternatively, controller 52 may provide the data for storage, and the conversion to storage values is carried out in the memory device.

Memory controller 52 communicates with a host 56, for accepting data for storage in the memory device and for outputting data retrieved from the memory device. In some embodiments, some or even all of the functions of controller 52 may be implemented in hardware. Alternatively, controller 52 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. For example, in some embodiments signal processing unit 44 may be omitted, and its functions performed by the memory controller. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and memory controller 52 are implemented as two separate Integrated Circuits (ICs). In alternative embodiments, however, the memory device and the memory controller may be integrated on separate semiconductor dies in a single Multi-Chip Package (MCP) or System on Chip (SoC). Further alternatively, some or all of the circuitry of the memory controller may reside on the same die on which the memory array is disposed. Further alternatively, some or all of the functionality of controller 52 can be implemented in software and carried out by a processor or other element of the host system. In some implementations, a single memory controller may be connected to multiple memory devices 24. In yet another embodiment, some or all of the memory controller functionality may be carried out by a separate unit, referred to as a memory extension, which acts as a slave of memory device 24. Typically, processor 64 in controller 52 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Trade-Off Between Readout Accuracy and Speed

Typically, a trade-off exists between the accuracy at which memory device 24 reads the storage values from memory cells 32, and the speed at which the storage values are read. Highly-accurate readout tends to be relatively slow, whereas fast readout often has a reduced accuracy. In the present context, the term "accuracy" means any measure of the certainty or fidelity at which the storage values read by the circuitry of memory device represent the actual storage values stored in the memory cells. In an accurate read operation, the differences between the read storage values and the respective actual storage values of the memory cells are small, and vice versa. Since any read operation has some inherent uncertainty, different read operations can be characterized by their reading accuracies. Several examples of read commands having different accuracies are described further below. The terms "high accuracy" and "fine accuracy" are used interchangeably herein.

In many practical cases, highly-accurate readout is not always needed. Some readout tasks can be carried out successfully at a reduced reading accuracy, and therefore at a higher speed. In some embodiments, memory device 24 and memory controller 52 support multiple predefined types of read commands for reading the storage values from memory cells 32. The different commands read the storage values at different accuracies. Each command has a respective execution time, which is typically longer for higher-accuracy commands and shorter for lower-accuracy commands.

Typically, when memory controller 52 prepares to read the storage values from a certain group of memory cells (e.g., a memory page), the controller evaluates a condition related to the read operation to be performed. Based on the evaluated condition, the memory controller selects one of the predefined read commands, and instructs the memory device to read the storage values in question using the selected command. Several examples of readout tasks that can be performed at different accuracy levels, of conditions that can be evaluated so as to select the appropriate read command, and of read commands having different accuracies and execution times, are described in detail below.

Figure 2:
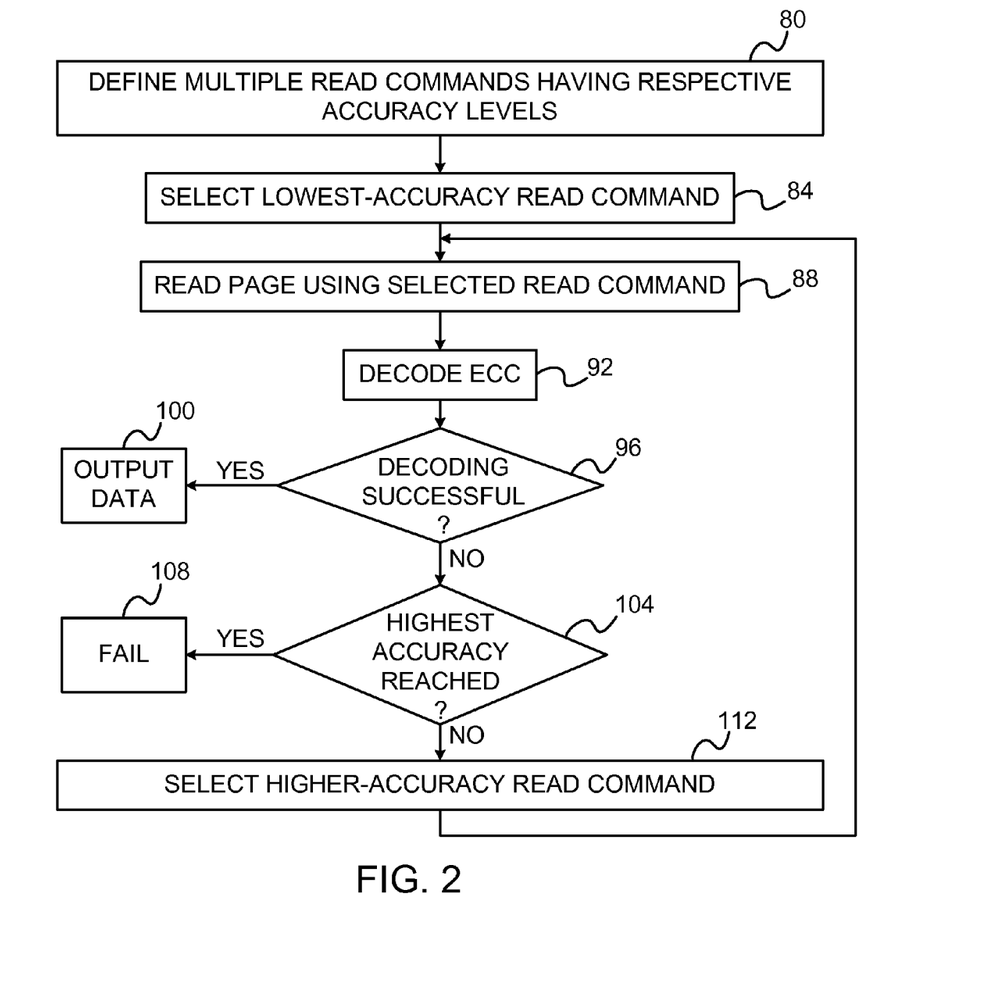
FIGS. 2 and 3 are flow charts that schematically illustrate methods for retrieving data from analog memory cells using read commands having different accuracy levels, in accordance with embodiments of the present invention.

FIG. 2 is a flow chart that schematically illustrates a method for retrieving data from analog memory cells 32 using read commands having different accuracy levels, in accordance with an embodiment of the present invention. The method begins with memory controller 52 initiating readout of a certain memory page, which is stored in a group of memory cells 32, at an initiation step 70. The memory controller assesses the desired readout accuracy by evaluating a condition related to the read operation to be performed, at an accuracy assessment step 74. The memory controller selects one of the predefined read commands, which has the desired accuracy, and reads the storage values corresponding to the page using the selected command, at a reading step 78. The memory controller typically reconstructs the stored data from the read storage values and outputs the reconstructed data to host 56.

Example Readout Tasks, Selection Criteria and Read Commands

The different read commands supported by memory device 24 and memory controller 52 may differ from one another in various ways, in order to provide different accuracy/speed trade-offs. For example, different read commands may have different sense times. The sense time is defined as the time duration over which sense circuitry 40 measures the bit line voltages or currents during a read operation. As can be appreciated, integrating the bit line current or voltage over a longer time duration averages the read noise and improves the readout accuracy. On the other hand, a longer sense time increases the execution time of the read command. Thus, device 24 and controller 52 may support a high-accuracy but relatively slow read command having a long sense time, and a lower-accuracy but relatively fast read command having a short sense time. In a certain NAND Flash device, for example, the long sense time may be on the order of 25 µS and the short sense time may be on the order of 10 µS, although any other suitable values can also be used. In some embodiments, the long sense time may be approximately twice the length of the short sense time, although any other suitable ratio can also be used.

As another example, different read commands may read the storage values using different numbers of read thresholds. As noted above, the R/W circuitry typically reads the storage values from memory cells 32 by comparing them to one or more read thresholds. In some embodiments, signal processing unit 44 can improve the reading accuracy by re-reading a certain set of storage values multiple times, using different read thresholds. For example, the multiple read results can be combined to form soft metrics of the read storage values, and these metrics can be used by ECC unit 68 in the memory controller to decode the ECC. Some aspects of data readout using multiple read thresholds are addressed in PCT International Publications WO 2007/132457, WO 2008/053472, WO 2008/111058 and WO 2008/139441, whose disclosures are incorporated herein by reference.

Typically, the readout accuracy improves as the number of read thresholds increases. On the other hand, re-reading a group of memory cells using a large number of read thresholds increases execution time. Thus, read commands that use different numbers of read thresholds will typically have different reading accuracies and execution times. In an embodiment, the memory device and memory controller may support a read command that reads the storage values using a small number of read thresholds (e.g., a single read threshold), and another read command that reads the storage values using a higher number of read thresholds (e.g., between two and five read thresholds).

When a given read commands uses a single read threshold, the read results can be viewed as hard metrics of the storage values. When a given read command uses multiple read thresholds, the read results can be combined or otherwise processed to produce soft metrics of the storage values. ECC unit 68 may decode the ECC based on these hard or soft metrics. Thus, a relatively fast command can be specified to produce hard metrics. A slower command may be specified to produce soft metrics, which generally enable higher accuracy in decoding the ECC. Alternatively, different commands that use different numbers of read thresholds can be viewed as producing soft metrics having different accuracies.

Typically, multiple-threshold readout is carried out by unit 44 internally to the memory device. In a typical process, the memory controller selects and sends the appropriate read command to the memory device, and the memory device executes the command by reading the storage values using the appropriate number of read thresholds.

In some embodiments, signal processing unit 44 applies certain signal processing mechanisms to the read storage values in order to increase their accuracy. For example, unit 44 may apply an interference cancellation process for canceling interference that distorts the read storage values. Techniques for estimating and cancelling distortion in memory cells are described, for example, in PCT International Publications WO 2007/132452, WO 2007/132453 and WO 2008/026203, whose disclosures are incorporated herein by reference, and in PCT International Publications WO 2007/132457, cited above. As another example, signal processing unit 44 may apply a mechanism that adaptively adjusts the positions of the read thresholds that are used for reading the storage values. Techniques for adaptively adjusting read threshold values are described, for example, in PCT International Publications WO 2008/053472 and WO 2008/111058, cited above.

Signal processing mechanisms, such as interference cancellation or adaptive threshold adjustment, improve the readout accuracy. On the other hand, these mechanisms are typically computationally intensive and therefore increase execution time and readout speed. Thus, in some embodiments, different read commands can apply signal processing mechanisms having different execution times, or refrain from applying such mechanisms, and as a result provide different accuracy/speed trade-offs.

For example, a given read command may apply interference cancellation to the read storage values, and another read command may read the storage values without applying interference cancellation. As another example, a given read command may adjust the read thresholds before reading the storage values, and another read command may read the storage values without adjusting the read thresholds.

In some embodiments, both unit 44 and memory controller 52 have signal processing capabilities. For example, an interference cancellation process or threshold adjustment process can be split between unit 44 and processor 52, such that each entity carries out a subset of the signal processing tasks. Memory controller is often capable of carrying out complex signal processing tasks as it often has a higher processing power than unit 44. Thus, moving signal processing functions from unit 44 to controller 52 may improve the readout accuracy. On the other hand, performing signal processing tasks by the memory controller often involves transferring larger volumes of data from the memory device to the memory controller, which increases the execution time. Thus, the partitioning of signal processing tasks between the memory controller and the memory device may provide different accuracy/speed trade-offs. Therefore, different read commands may split the signal processing tasks differently between the memory controller and the memory device.

For example, a certain read command may apply a fast but limited-accuracy threshold adaptation process internally to the memory device. Another read command may apply a more complex and higher-accuracy threshold adaptation process by the memory controller. The latter command is typically slower, since it involves transferring larger amounts of data (results of re-read operations) from the memory device to the memory controller.

As another example, unit 44 in the memory device may be configurable to perform a limited-performance interference cancellation process on the data read from the memory cells. Memory controller 52 may be configurable to perform a high-performance interference cancellation process, which may be slower than the process applied internally to the memory device. A certain read commands may use only the interference cancellation process applied in the memory device. Another read command may use only the controller's interference cancellation process. Yet another read command may apply both processes to the read data.

The read commands described above are chosen purely by way of example. In alternative embodiments, memory device 24 and memory controller 52 may use any other suitable set of two or more predefined read commands, which have different readout accuracies and execution times. In particular, the example techniques described above can be combined to produce commands having various accuracy/trade-offs. For example, a highly-accurate read command may use a long sense time, apply interference cancellation and read the storage values using multiple thresholds that are adjusted adaptively. A low-accuracy but high-speed read command may use a short sense time and read the storage values using a single, fixed read threshold.

Memory controller 52 may evaluate different conditions in order to select one of the predefined read commands for performing a given readout task. For example, a group of memory cells that has gone through a large amount of wear (e.g., a large number of programming and erasure cycles and/or long retention periods) may suffer from a high level of distortion, and should therefore be read at high accuracy. A group of memory cells that has gone through a small amount of wear may be read successfully at a lower accuracy and at a higher speed. Thus, in some embodiments, the memory controller selects the read command based on the wear level of the memory cells to be read. Any suitable measure or estimate of the wear level can be used, such as the actual or estimated number of programming and erasure cycles applied to the cells, and/or the time that elapsed since the last programming operation.

This sort of condition may be applied to each individual group of cells, assuming that wear level information is available per cell group. Alternatively, the memory controller may apply the selection jointly for an entire block or even to the entire memory device. For example, the memory controller may use a fast but low-accuracy read command at the beginning of the memory device's lifetime, and switch to a higher-accuracy but slower read command at a later point along the lifetime of the memory device.

As another example, the memory controller may initially select a fast read command by default. If the data cannot be reconstructed successfully using this read command (e.g., if ECC decoding fails), the memory controller may re-attempt to read the storage values using a slower but higher-accuracy command.

In some embodiments, the read command is selected internally in the memory device, such as by signal processing unit 44 or by the R/W circuitry. For example, applying interference cancellation to a certain group of memory cells typically involves reading the storage values from both the interfered memory cells and other memory cells (typically neighboring cells) that potentially cause the interference. In many practical cases, the interference can be canceled successfully even if the storage values of the interfering memory cells are known at a low accuracy. Thus, when applying interference cancellation, the memory device may read the storage values of the potentially-interfering cells using a fast but low-accuracy command.

In some embodiments, memory cells 32 comprise multi-level cells, each storing multiple data bits. In many data storage schemes, different bits in a group of memory cells are used for storing different memory pages. Consider, for example, a group of 3 bit/cell memory cells. Each memory cell stores three bits, which are referred to as a Least Significant Bit (LSB), a Center Significant Bit (CSB) and a Most Significant Bit (MSB). The LSBs of the cells in the group are used for storing a certain page, the CSBs store a different page, and yet another page is stored in the MSBs. In these embodiments, the pages stored in different significance bits often have different error probabilities. Therefore, different significance bits can be read using different read commands. This selection can be performed either by the memory controller or by the memory device, as appropriate.

As yet another example, the R/W circuitry may program the memory cells using an iterative Program and Verify (P&V) process. In a typical P&V process, an entire memory page is written by applying a sequence of programming pulses to the group of memory cells that are mapped to this page. The amplitude of the programming pulses increases incrementally from pulse to pulse. The storage values programmed into the cells are read ("verified") after each pulse, and the iterations continue until the desired levels are reached. Typically, programming verification can be performed successfully even if the storage values are read at a low accuracy. Thus, the R/W circuitry may read the storage values during verification reading tasks using a fast but low-accuracy command.

As another example, in some embodiments the memory device or the memory controller adjusts the read thresholds used in read operations, based on the statistical distribution of the storage values stored in the memory cells. For example, device 24 or controller 52 may perform one or more read operations for estimating the Cumulative Distribution Function (CDF) of the cell storage values, and then adjust the read thresholds based on the estimated CDF. Techniques of this sort are described, for example, in PCT International Publication WO 2008/111058, cited above. Typically, read operations performed in order to estimate the storage value distribution can be performed at low accuracy.

Further alternatively, the appropriate predefined read command for performing a certain readout task can be selected based on any other suitable condition. For example, two or more of the above-mentioned conditions can be combined. Although certain conditions are referred to above as being evaluated by the memory controller, the condition evaluation and/or command selection can be performed by the memory controller or by circuitry internal to the memory device, as desired.

In some embodiments, the memory controller configures the memory device so as to set various attributes of the read commands. The memory controller may configure any read command attribute, such as, for example, the number and values of read thresholds, sense times and/or interference cancellation parameters. The controller may configure attributes of a single read command, all commands or a subset of the commands. In some embodiments, the memory controller may estimate the impairments in the memory cells along the memory device's life cycle, and adapt the read command attributes accordingly.

Progressive Selection of Read Commands

In some embodiments, memory controller 52 initially reads data from memory device 24 using fast and limited-accuracy read commands. The memory controller reverts to higher-accuracy but slower read commands only if data readout fails.

Figure 3:
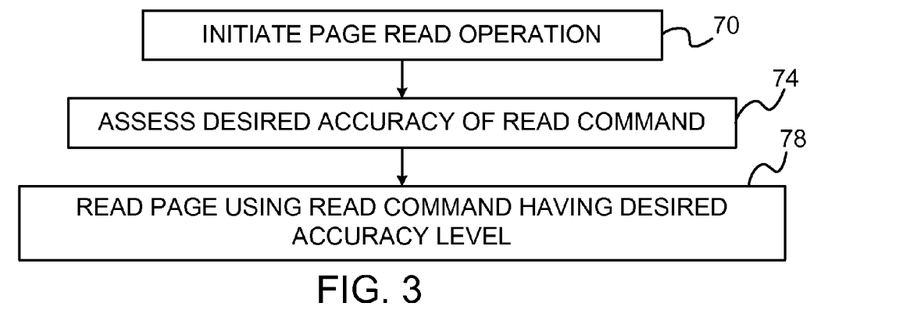

FIG. 3 is a flow chart that schematically illustrates a method for retrieving data from analog memory cells 32 using read commands having different accuracy levels, in accordance with an embodiment of the present invention. The method begins by defining multiple read commands having respective different accuracy levels, at a definition step 80. These commands are supported by both memory device 24 and memory controller 52.

When preparing to read the storage values from a certain group of memory cells (e.g., to read a certain memory page), the memory controller initially selects the read command having the lowest accuracy, at an initial selection step 84. This command typically has the shortest execution time.

The memory controller instructs the memory device to read a certain page using the currently-selected read command, at a reading step 88. The memory device reads the requested page using this command and provides the read results to the memory controller.

The memory controller attempts to decode the ECC based on the read results provided by the memory device, in order to reconstruct the data, at an ECC decoding step 92. The memory controller checks whether ECC decoding is successful, at a decoding checking step 96. If successful, the memory controller output the reconstructed data to host 56, at an output step 100, and the method terminates.

If, on the other hand, ECC decoding has failed, the memory controller checks whether the currently-selected read command is the command having the highest accuracy, at an accuracy checking step 104. If the currently-selected read command is the highest-accuracy command, the memory controller declares that the page read operation has failed, at a failure step 108, and the method terminates.

Otherwise, the memory controller selects a different read command, whose accuracy is higher than that of the currently-selected command, at a selection update step 112. The method then loops back to step 88 above, in which the memory controller reads the requested page using the newly-selected read command. The memory controller continues to read the requested page using read commands that progressively increase in accuracy, until ECC decoding is successful or until all predefined commands have been exhausted.

Using the progressive method of FIG. 3, the readout accuracy is matched to the actual characteristics of the page in question. The memory controller attempts to read the data using fast read commands first, and reverts to slower commands only if higher accuracy is needed.

When the memory controller re-reads a certain page using a high-accuracy command after failure of a lower-accuracy command, the memory controller can still use the results of the lower-accuracy command that failed. For example, the results of the lower-accuracy command can be combined with (or otherwise used to refine) the read results of the higher-accuracy command. Consider, for example, the above-mentioned configuration in which both the controller and the memory device are capable of performing interference cancellation. In such a configuration, the controller may initially read the page with a fast read command that performs no interference cancellation. If the ECC fails, the controller re-reads the page with a command that activates the memory device's interference cancellation mechanism. If the ECC fails again, the memory controller may apply both the memory device's and the memory controller's interference cancellation mechanisms.

In some embodiments, the memory device and memory controller support a command interface, using which the memory controller instructs the memory device to execute the appropriate read commands. Such commands may instruct the memory controller to apply a certain predefined read command (e.g., a command having a certain sense time), to activate or deactivate a certain signal processing mechanism implemented internally to the memory device, to set attribute values such as read thresholds or interference cancellation parameters, and/or to instruct the memory device to perform any suitable action or configure any suitable attribute in order to execute the read commands described herein.

Readout Configurations with Reduced Sense Time

In some embodiments, system 20 employs multiple readout configurations having different sense times, i.e., different time durations over which sense circuitry 40 measures the bit line voltages or currents during a read operation. When preparing to retrieve data from a certain group of memory cells, the system evaluates a certain condition, and selects the appropriate readout configuration based on this condition. Several examples of such readout configurations are described below.

Although the embodiments described below refer to two readout configurations—a normal configuration and a reduced-sense-time configuration—the disclosed techniques can be used with any other suitable number of readout configurations having different sense times. In some embodiments, memory controller 52 and memory device 24 support one or more readout commands using which the memory controller specifies the readout configuration to be used for retrieving certain data. In alternative embodiments, the memory device evaluates the condition and selects the appropriate readout configuration irrespective of the memory controller.

Figure 4:
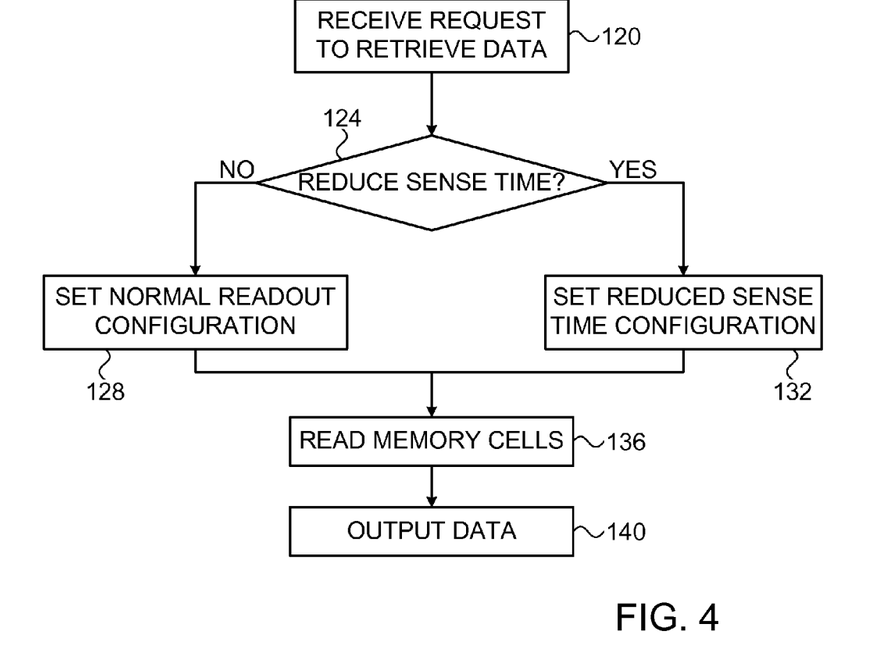
FIG. 4 is a flow chart that schematically illustrates a method for retrieving data from analog memory cells with reduced sense time, in accordance with an embodiment of the present invention.

FIG. 4 is a flow chart that schematically illustrates a method for retrieving data from analog memory cells 32 with reduced sense time, in accordance with an embodiment of the present invention. The method begins with memory controller 52 accepting a request from host 56 to retrieve certain data, at a request step 120. The data in question is stored in a certain group of memory cells 32, e.g., in a certain page that belongs to a certain word line.

The memory controller holds a definition of two or more readout configurations that differ from one another in sense time. The present example refers to two readout configurations—a normal configuration and a reduced-sense-time configuration. The memory controller evaluates a condition that indicates whether the memory cell group in question is to be read using the normal or the reduced-sense-time readout configuration, at a condition evaluation step 124. Any suitable condition can be used for this purpose. For example, the memory controller may use any of the above-described conditions used for selecting read commands.

If the memory cell group is to be read using a normal sense time, the memory controller sets memory device 24 to the normal readout configuration, at a normal setting step 128. If, on the other hand, the memory cell group is to be read using a reduced sense time, the memory controller sets the memory device to reduced-sense-time readout configuration, at a reduced-time setting step 132. The memory device then reads the memory cells in the group using the selected readout configuration, at a readout step 136. The memory controller outputs the read data, at an output step 140.

The embodiments described herein refer to a certain partitioning of tasks between the memory device and the memory controller. This choice, however, is made purely by way of example. In alternative embodiments, the tasks of evaluating the condition, selecting and setting the appropriate readout configuration and reading the memory cells can be divided in any desired way between the memory device and memory controller, or even performed exclusively by only one of them.

Typically, each of the memory cells belongs to a respective bit line. Readout is performed by pre-charging the bit lines, allowing them to discharge, and sensing the bit line currents or voltages after a certain discharge period. Thus, the sensed storage values depend on the bit line conductivity. In some of the disclosed techniques, the choice of readout configuration affects the electrical conductivities of the bit lines to which the memory cells in the group belong. Consequently, longer or shorter sense times can be set.

When the bit line conductivity is better (i.e., higher—meaning smaller bit line resistance), the bit line discharges at a faster rate and therefore can be sensed with a shorter sense time. When the bit line conductivity is poorer, the bit line discharges at a slower rate and therefore a longer sense time may be needed. Lower bit line conductivity is typically set only selectively, when possible or when required, because improving the bit line conductivity may degrade other system performance measures.

Various techniques can be used to selectively increase the bit line conductivity during readout. In some embodiments, the readout configurations differ from one another in the pass voltages ($V_{PASS}$) that are applied during readout to unselected word lines in the memory block, i.e., to the word lines other than the word line being read. In one embodiment, the normal readout configuration sets a certain default set of pass voltages. The reduced-sense-time readout configuration sets another set of pass voltages, at least one of which is higher than the corresponding pass voltage in the normal readout configuration.

Setting a higher pass voltage helps to improve the bit line conductivity, and therefore enables shorter sense time. On the other hand, increasing the pass voltage may increase the probability of over-programming, read disturb or other impairments. Therefore, this technique is typically used only selectively, e.g., when conditions permit, when other impairments are tolerable or when short sense time is particularly important.

In alternative embodiments, the readout configurations differ from one another in the read thresholds used for reading the group of memory cells. In one embodiment, the normal readout configuration sets a certain default set of (one or more) read thresholds. The reduced-sense-time readout configuration sets another set of read thresholds, at least one of which is higher than the corresponding read threshold in the normal readout configuration.

Figure 5:
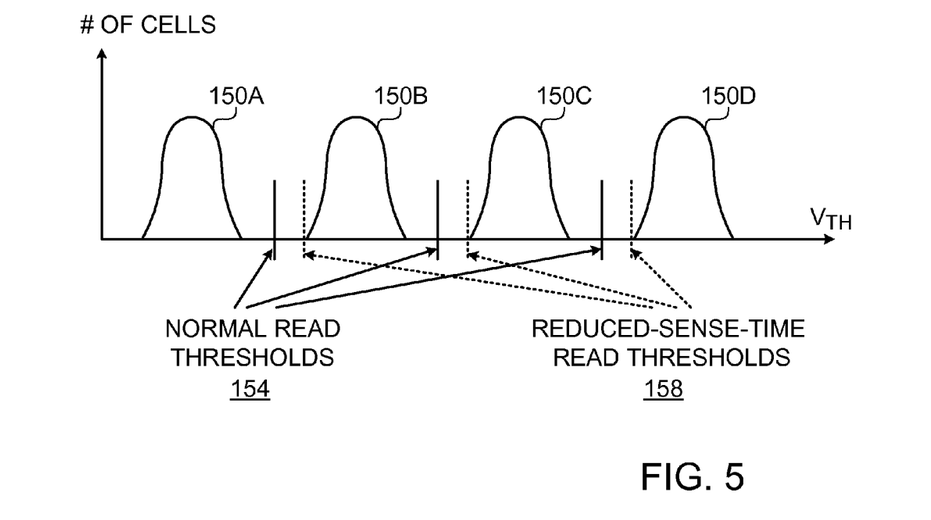
FIG. 5 is a graph showing programming levels in a group of analog memory cells and associated normal and reduced-sense-time read thresholds, in accordance with an embodiment of the present invention.

FIG. 5 is a graph showing programming levels in a group of analog memory cells and associated normal and reduced-sense-time read thresholds, in accordance with an embodiment of the present invention. The example of FIG. 5 refers to a group of four-level, 2 bits/cell memory cells. After programming, the storage values (in the present example threshold voltages) of the memory cells are distributed in four programming level distributions 150A ... 150D, which correspond to the four possible two-bit combinations. Device 24 typically retrieves the data stored in these memory cells by positioning three read thresholds between the programming level distributions, and comparing the cell storage values to the read thresholds.

In some embodiments, normal read thresholds 154 are marked in the figure with solid lines. Reduced-sense-time read thresholds 158 are marked in the figure with dashed lines. As can be seen in the figure, the reduced-sense-time read thresholds are higher than the respective normal read thresholds.

Increasing a given read threshold helps to improve the bit line conductivity, and therefore enables the use of shorter sense time. On the other hand, the reduced-sense-time read thresholds may increase the probability of read errors, since they are typically closer to the programming level distributions in comparison with the corresponding normal read thresholds.

In the example of FIG. 5, the normal read thresholds are positioned approximately at the mid-way points between adjacent programming level distributions. This setting typically yields low error probability. The reduced-sense-time read thresholds, on the other hand, are positioned at the upper edges of the boundary regions separating the adjacent programming level distributions. This setting is typically sub-optimal in terms of error probability, but may be preferred in some cases in order to improve bit line conductivity and enable short sense time. In some embodiments, the reduced-sense-time read thresholds may be positioned even further higher, slightly within the programming level distributions. This setting further shortens sense time at the expense of read errors (which can be corrected, for example, using an error correction code).

In some embodiments, memory controller 52 sets the sense time for reading a certain word line depending on the number of other word lines in the same block that are programmed with data. The rationale behind this technique is that erased (non-programmed) memory cells improve the bit line conductivity, whereas programmed memory cells degrade it. When a memory block has only a small number of programmed word lines, the conductivity of the bit lines in the block is typically good, and it is typically possible to read the desired word line with a short sense time. If, on the other hand, the block has many programmed word lines (i.e., few erased cells per bit line), the bit line conductivities may be poorer and a longer sense time may be needed.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for data storage, comprising:
providing at least first and second readout configurations for reading storage values from analog memory cells, such that the first readout configuration reads the storage values with a first sense time and the second readout configuration reads the storage values with a second sense time, shorter than the first sense time;
evaluating a condition with respect to a read operation that is to be performed over a group of the memory cells;
selecting one of the first and second readout configurations responsively to the evaluated condition; and
reading the storage values from the group of the memory cells using the selected readout configuration.

2. The method according to claim 1, wherein the memory cells in the group belong to respective bit lines, wherein the first readout configuration sets at least one of the bit lines to have a first conductivity, and wherein the second readout configuration sets the at least one of the bit lines to have a second conductivity, greater than the first conductivity.

3. The method according to claim 1, wherein the memory cells in the group belong to a word line selected from among multiple word lines, wherein the first readout configuration applies first pass voltages to the word lines other than the selected word lines while reading the group of memory cells, and wherein the second readout configuration applies second pass voltages to the word lines other than the selected word lines, such that at least one of the second pass voltages is higher than a corresponding one of the first pass voltages.

4. The method according to claim 1, wherein the first readout configuration reads the storage values using a first set of read thresholds, and wherein the second readout configuration reads the storage values using a second set of read thresholds, such that at least one of the second read thresholds is higher than a corresponding one of the first read thresholds.

5. The method according to claim 1, wherein the memory cells in the group belong to a word line in a memory block that comprises multiple word lines, and wherein evaluating the condition comprises assessing a number of the word lines in the memory block that are programmed with data.

6. The method according to claim 1, wherein the first readout configuration reads the storage values with a first accuracy, and wherein the second readout configuration reads the storage values with a second accuracy that is coarser than the first accuracy.

7. The method according to claim 1, wherein evaluating the condition comprises assessing a wear level of the group of the memory cells.

8. The method according to claim 1, wherein evaluating the condition and selecting the one of the readout configurations comprise selecting the second readout configuration responsively to determining that the read operation reads the storage values from potentially-interfering memory cells in an interference cancellation process.

9. The method according to claim 1, wherein evaluating the condition and selecting the one of the readout configurations comprise selecting the second readout configuration responsively to determining that the read operation verifies the storage values that were written into the given group of the memory cells.

10. The method according to claim 1, wherein each of the memory cells in the group stores at least first and second bits, and wherein evaluating the condition and selecting the one of the readout configurations comprise selecting the second readout configuration responsively to determining that the read operation reads the first bits from the memory cells, and selecting the first readout configuration responsively to determining that the read operation reads the second bits from the memory cells.

11. The method according to claim 1, wherein evaluating the condition and selecting the one of the readout configurations comprise selecting the second readout configuration responsively to determining that the read operation is used for estimating a statistical distribution of the storage values that were written into the given group of the memory cells.

12. The method according to claim 1, wherein the storage values represent stored data, and wherein evaluating the condition and selecting the one of the readout configurations comprise making an attempt to read the storage values from the memory cells in the group using the second readout configuration and to reconstruct the stored data from the read storage values, and selecting the first readout configuration upon a failure of the attempt.

13. The method according to claim 12, wherein the stored data is encoded with an Error Correction Code (ECC), and wherein making the attempt comprises decoding the ECC.

14. The method according to claim 12, and comprising re-attempting to reconstruct the stored data using both the storage values read by the first readout configuration and the storage values read using the second readout configuration.

15. Apparatus for data storage, comprising:
a plurality of analog memory cells; and
circuitry, which is configured to evaluate a condition with respect to a read operation that is to be performed over a group of the memory cells, to select, responsively to the evaluated condition, between at least first and second readout configurations for reading storage values from the analog memory cells, such that the first readout configuration reads the storage values with a first sense time and the second readout configuration reads the storage values at a second sense time that is shorter than the first sense time, and to read the storage values from the group of the memory cells using the selected readout configuration.

16. The apparatus according to claim 15, wherein the memory cells in the group belong to respective bit lines, wherein the first readout configuration sets at least one of the bit lines to have a first conductivity, and wherein the second readout configuration sets the at least one of the bit lines to have a second conductivity, greater than the first conductivity.

17. The apparatus according to claim 15, wherein the memory cells in the group belong to a word line selected from among multiple word lines, wherein the first readout configuration applies first pass voltages to the word lines other than the selected word lines while reading the group of memory cells, and wherein the second readout configuration applies second pass voltages to the word lines other than the selected word lines, such that at least one of the second pass voltages is higher than a corresponding one of the first pass voltages.

18. The apparatus according to claim 15, wherein the first readout configuration reads the storage values using a first set of read thresholds, and wherein the second readout configuration reads the storage values using a second set of read thresholds, such that at least one of the second read thresholds is higher than a corresponding one of the first read thresholds.

19. The apparatus according to claim 15, wherein the memory cells in the group belong to a word line in a memory block that comprises multiple word lines, and wherein the circuitry is configured to evaluate the condition by assessing a number of the word lines in the memory block that are programmed with data.

20. The apparatus according to claim 15, wherein the first readout configuration reads the storage values with a first accuracy, and wherein the second readout configuration reads the storage values with a second accuracy that is coarser than the first accuracy.

21. The apparatus according to claim 15, wherein the circuitry is configured to evaluate the condition by assessing a wear level of the group of the memory cells.

22. The apparatus according to claim 15, wherein the circuitry is configured to select the second readout configuration responsively to determining that the read operation reads the storage values from potentially-interfering memory cells in an interference cancellation process.

23. The apparatus according to claim 15, wherein the circuitry is configured to select the second readout configuration responsively to determining that the read operation verifies the storage values that were written into the given group of the memory cells.

24. The apparatus according to claim 15, wherein each of the memory cells in the group stores at least first and second bits, and wherein the circuitry is configured to select the second readout configuration responsively to determining that the read operation reads the first bits from the memory cells, and to select the first readout configuration responsively to determining that the read operation reads the second bits from the memory cells.

25. The apparatus according to claim 15, wherein the circuitry is configured to select the second readout configuration responsively to determining that the read operation is used for estimating a statistical distribution of the storage values that were written into the given group of the memory cells.

26. The apparatus according to claim 15, wherein the storage values represent stored data, and wherein the circuitry is configured to make an attempt to read the storage values from the memory cells in the group using the second readout configuration and to reconstruct the stored data from the read storage values, and to select the first readout configuration upon a failure of the attempt.

27. The apparatus according to claim 26, wherein the stored data is encoded with an Error Correction Code (ECC), and wherein the circuitry is configured to make the attempt by decoding the ECC.

28. The apparatus according to claim 26, wherein the circuitry is configured to re-attempt to reconstruct the stored data using both the storage values read by the first readout configuration and the storage values read using the second readout configuration.

29. Apparatus for data storage, comprising:

an interface for communicating with a memory that includes a plurality of analog memory cells; and circuitry, which is configured to evaluate a condition with respect to a read operation that is to be performed over a group of the memory cells, to select, responsively to the evaluated condition, between at least first and second readout configurations for reading storage values from the analog memory cells, such that the first readout configuration reads the storage values with a first sense time and the second readout configuration reads the storage values at a second sense time that is shorter than the first sense time, and to read the storage values from the group of the memory cells using the selected readout configuration.

* * * * *